(12) United States Patent
Higaki et al.

(10) Patent No.: US 8,786,794 B2
(45) Date of Patent: Jul. 22, 2014

(54) SEMICONDUCTOR DEVICE

(71) Applicant: Semiconductor Energy Laboratory Co., Ltd., Kanagawa-ken (JP)

(72) Inventors: Yoshinari Higaki, Hiroshima (JP); Masayuki Sakakura, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/967,645

(22) Filed: Aug. 15, 2013

(65) Prior Publication Data
US 2013/0328050 A1 Dec. 12, 2013

Related U.S. Application Data

(63) Continuation of application No. 12/978,844, filed on Dec. 27, 2010, now Pat. No. 8,514,341, which is a continuation of application No. 10/576,177, filed as application No. PCT/JP2005/017223 on Sep. 13, 2005, now Pat. No. 7,859,606.

(30) Foreign Application Priority Data

Sep. 15, 2004 (JP) .................................. 2004-267673

(51) Int. Cl.
*G02F 1/136* (2006.01)
(52) U.S. Cl.
USPC .............................................. 349/46; 349/42
(58) Field of Classification Search
None
See application file for complete search history.

(56) References Cited

U.S. PATENT DOCUMENTS

| | | |
|---|---|---|
| 5,187,604 A | 2/1993 | Taniguchi et al. |
| 5,623,157 A | 4/1997 | Miyazaki et al. |
| 5,640,067 A | 6/1997 | Yamauchi et al. |
| 5,668,379 A | 9/1997 | Ono et al. |
| 5,684,365 A | 11/1997 | Tang et al. |
| 5,714,407 A | 2/1998 | Maeno et al. |
| 5,760,854 A | 6/1998 | Ono et al. |
| 5,804,878 A | 9/1998 | Miyazaki et al. |
| 5,897,328 A | 4/1999 | Yamauchi et al. |

(Continued)

FOREIGN PATENT DOCUMENTS

| | | |
|---|---|---|
| EP | 0 694 804 A2 | 1/1996 |
| EP | 1 394 597 A2 | 3/2004 |

(Continued)

OTHER PUBLICATIONS

International Search Report re application No. PCT/JP2005/017223, dated Dec. 27, 2005.

(Continued)

*Primary Examiner* — Tina Wong
(74) *Attorney, Agent, or Firm* — Husch Blackwell LLP

(57) ABSTRACT

It is an object of the present invention to connect a wiring, an electrode, or the like formed with two incompatible films (an ITO film and an aluminum film) without increasing the cross-sectional area of the wiring and to achieve lower power consumption even when the screen size becomes larger. The present invention provides a two-layer structure including an upper layer and a lower layer having a larger width than the upper layer. A first conductive layer is formed with Ti or Mo, and a second conductive layer is formed with aluminum (pure aluminum) having low electric resistance over the first conductive layer. A part of the lower layer projected from the end section of the upper layer is bonded with ITO.

12 Claims, 14 Drawing Sheets

(56) References Cited

U.S. PATENT DOCUMENTS

| | | |
|---|---|---|
| 5,929,527 A | 7/1999 | Yamazaki et al. |
| 6,031,290 A | 2/2000 | Miyazaki et al. |
| 6,166,396 A | 12/2000 | Yamazaki |
| 6,166,414 A | 12/2000 | Miyazaki et al. |
| 6,323,051 B1 | 11/2001 | Shimada |
| 6,407,780 B1 | 6/2002 | Sung |
| 6,414,730 B1 | 7/2002 | Akamatsu et al. |
| 6,433,842 B1 | 8/2002 | Kaneko et al. |
| 6,448,612 B1 | 9/2002 | Miyazaki et al. |
| 6,495,857 B2 | 12/2002 | Yamazaki |
| 6,567,145 B1 | 5/2003 | Kaneko et al. |
| 6,608,353 B2 | 8/2003 | Miyazaki et al. |
| 6,825,488 B2 | 11/2004 | Yamazaki et al. |
| 6,844,628 B2 | 1/2005 | Yamazaki et al. |
| 6,853,083 B1 | 2/2005 | Yamauchi et al. |
| 6,861,670 B1 | 3/2005 | Ohtani et al. |
| 6,940,094 B2 | 9/2005 | Yamazaki et al. |
| 6,979,882 B1 | 12/2005 | Yamazaki et al. |
| 6,992,435 B2 | 1/2006 | Yamauchi et al. |
| 7,071,037 B2 | 7/2006 | Suzawa et al. |
| 7,154,218 B2 | 12/2006 | Murakami et al. |
| 7,164,171 B2 | 1/2007 | Yamazaki et al. |
| 7,196,748 B2 | 3/2007 | Chae |
| 7,238,600 B2 | 7/2007 | Yamazaki et al. |
| 7,265,799 B2 | 9/2007 | Souk et al. |
| 7,294,855 B2 | 11/2007 | Baek et al. |
| 7,403,240 B2 | 7/2008 | Souk et al. |
| 7,742,118 B2 | 6/2010 | Souk et al. |
| 7,804,142 B2 | 9/2010 | Yamazaki et al. |
| 7,883,942 B2 | 2/2011 | Baek et al. |
| 8,068,188 B2 | 11/2011 | Souk et al. |
| 2001/0001496 A1 | 5/2001 | Yamazaki |
| 2002/0024298 A1 | 2/2002 | Fukunaga |
| 2002/0080293 A1 | 6/2002 | Chae |
| 2002/0110941 A1 | 8/2002 | Yamazaki et al. |
| 2002/0163049 A1 | 11/2002 | Yamazaki et al. |
| 2002/0171085 A1 | 11/2002 | Suzawa et al. |
| 2002/0179969 A1 | 12/2002 | Miyazaki et al. |
| 2002/0179972 A1 | 12/2002 | Yamazaki et al. |
| 2002/0179973 A1 | 12/2002 | Yamazaki et al. |
| 2003/0054653 A1 | 3/2003 | Yamazaki et al. |
| 2003/0189210 A1 | 10/2003 | Yamazaki et al. |
| 2004/0023445 A1 | 2/2004 | Miyazaki et al. |
| 2004/0051102 A1 | 3/2004 | Miyazaki et al. |
| 2004/0241931 A1 | 12/2004 | Akimoto et al. |
| 2005/0056848 A1 | 3/2005 | Yamazaki et al. |
| 2005/0145847 A1 | 7/2005 | Miyazaki et al. |
| 2005/0146262 A1 | 7/2005 | Yamauchi et al. |
| 2005/0206008 A1 | 9/2005 | Yamazaki et al. |
| 2006/0006794 A1 | 1/2006 | Sakakura et al. |

FOREIGN PATENT DOCUMENTS

| | | |
|---|---|---|
| JP | 55-124245 A | 9/1980 |
| JP | 02-137329 A | 5/1990 |
| JP | 5-323373 | 12/1993 |
| JP | 6-202146 | 7/1994 |
| JP | 6-232129 | 8/1994 |
| JP | 6-308529 | 11/1994 |
| JP | 7-312425 | 11/1995 |
| JP | 08-018061 A | 1/1996 |
| JP | 08-043853 A | 2/1996 |
| JP | 8-330600 | 12/1996 |
| JP | 9-45927 | 2/1997 |
| JP | 10-32202 | 2/1998 |
| JP | 10-282520 A | 10/1998 |
| JP | 2000-77669 | 3/2000 |
| JP | 2001-281694 | 10/2001 |
| JP | 2001-281704 | 10/2001 |
| JP | 2003-152188 | 5/2003 |
| JP | 2004-6974 | 1/2004 |
| JP | 2004-96115 | 3/2004 |
| JP | 2004-226975 A | 8/2004 |

OTHER PUBLICATIONS

Written Opinion re application No. PCT/JP2005/017223, dated Dec. 27, 2005.

▲: sample 1 (comparative example)
●: sample 2 (present invention)

▲: sample 1 (comparative example)
●: sample 2 (present invention)

SEMICONDUCTOR DEVICE

This application is a continuation of copending application Ser. No. 12/978,844 filed on Dec. 27, 2010 which is a continuation of application Ser. No. 10/576,177 filed on Apr. 19, 2006 (now U.S. Pat No. 7,859,606 issued Dec. 28, 2010) which is the U.S. national stage of PCT/JP2005/017223 filed on Sep. 13, 2005, all of which are incorporated herein by reference.

TECHNICAL FIELD

The present invention relates to a semiconductor device having a circuit which includes a thin film transistor (hereinafter referred to as a TFT) and also relates to a manufacturing method thereof. For example, the present invention relates to an electronic appliance in which a light-emitting display device having an organic light-emitting element or an electronic optical device typified by a liquid crystal display panel is mounted as its component.

It is to be noted that the semiconductor devices in this specification indicate all the devices which can operate by using semiconductor characteristics, and an electronic optical device, a semiconductor circuit, and an electronic appliance are all included in the semiconductor devices.

BACKGROUND ART

In recent years, a technique for forming a thin film transistor (TFT) using a semiconductor thin film (having a thickness of approximately several nm to several hundred nm) formed over a substrate having an insulating surface is attracting attention. Thin film transistors are widely applied to electronic devices such as an IC or an electronic optical device. In particular, the development of a thin film transistor as a switching element in an image display device is advanced rapidly.

Conventionally, in an active matrix liquid crystal display device driven by TFTs, a large number of scanning lines and data lines are provided vertically and horizontally over a substrate and a large number of TFTs are provided in accordance with the intersections of these wirings. In each TFT, a gate wiring is electrically connected to the scanning line, a source electrode is electrically connected to the data line, and a drain electrode is electrically connected to a pixel electrode.

In a transmissive liquid crystal display device, ITO which has both light-transmitting properties and electric conductivity is commonly used for the pixel electrode. This pixel electrode and metal wirings such as a data line and a scanning line are insulated by a layer made of an insulating material. The pixel electrode and the metal wirings are in contact with each other through a contact hole formed at a particular location in the insulating film.

As the area of a display screen becomes larger, the delay of a signal due to the resistance of wirings becomes a more notable problem. Therefore, it is necessary to drastically change the shape of a wiring and an electrode or to use a low-resistant material such as aluminum for the wiring and the electrode.

When aluminum used as the material of the wiring and the electrode contacts ITO used as the material of the pixel electrode, a reaction called electric erosion occurs at the junction interface. Further, when aluminum contacts ITO, the surface of aluminum is oxidized and becomes electrically non-conductive.

Consequently, in order to prevent the electric erosion when the wiring, the electrode, and the like formed with such two incompatible films are connected, a technique has been suggested in which a metal film having a high melting point (such as a titanium film), a metal compound film having a high melting point (such as a titanium nitride film), or the like is provided between ITO and an aluminum wiring (or electrode) to avoid the electric erosion with ITO.

The present applicant describes in Patent Documents 1 to 3 that a drain of a thin film transistor and ITO serving as a pixel electrode are connected by sandwiching therebetween a multilayer film including a titanium film, an aluminum film, and a titanium film.

Further, the present applicants describe in Patent Document 4 that a drain of a thin film transistor and ITO serving as a pixel electrode are connected by sandwiching therebetween a multilayer film including a titanium film and an aluminum film. Moreover, the present applicants describe in Patent Document 5 that a drain of a thin film transistor and ITO serving as a pixel electrode are connected by sandwiching therebetween a multilayer film including a titanium nitride film and an aluminum film.

The present applicant also describes in Patent Document 6 that a gate electrode of a thin film transistor is formed with two layers having different widths so as to form a GOLD structure.

[Patent Document 1]
 Japanese Published Patent Application Laid-Open No.: H9-45927
[Patent Document 2]
 Japanese Published Patent Application Laid-Open No.: H10-32202
[Patent Document 3]
 Japanese Published Patent Application Laid-Open No.: H6-232129
[Patent Document 4]
 Japanese Published Patent Application Laid-Open No.: 2004-6974
[Patent Document 5]
 Japanese Published Patent Application Laid-Open No.: H8-330600
[Patent Document 6]
 Japanese Published Patent Application Laid-Open No.: 2001-281704

DISCLOSURE OF INVENTION

However, when a titanium film or a titanium nitride film is stacked between an aluminum wiring (or electrode) and ITO, the wiring resistance increases, which causes an increase in power consumption particularly when the display screen has a larger size. The wiring resistance can be decreased by increasing the cross-sectional area of a metal film to be the wiring; however, a step difference appears between the surface of the substrate and the surface of the thick wiring in the case of increasing the cross-sectional area by increasing the film thickness, which causes liquid crystal to have an orientation defect.

Even in an active matrix light-emitting device driven by TFTs, a transparent conductive film may be employed as an anode (or a cathode) of a light-emitting element. Similarly, the anode including the transparent conductive film is formed over an interlayer insulating film for being electrically isolated from various wirings. Therefore, when ITO used as the anode is connected to the electrode (aluminum) of the TFT, the above-mentioned electric erosion occurs in the same way.

It is an object of the present invention to connect a wiring, an electrode, and the like formed with two incompatible films (an ITO film and an aluminum film), without increasing the cross-sectional area of the wiring, and achieve low power consumption even when a display screen is large.

In the case of manufacturing TFTs by using aluminum as a wiring material, a projection such as a hillock or a whisker may be formed or an aluminum atom may diffuse to a channel-forming region due to heat treatment, thereby causing an operation defect of the TFTs and the decrease in the characteristics of the TFTs. Consequently, an aluminum alloy film in which another element (for example Si) is contained in aluminum is conventionally used to prevent the generation of the hillock and the like. However, even such an aluminum alloy film cannot solve the problem in that the junction resistance changes due to the oxidation of the aluminum and the reduction of the ITO film at the junction interface.

In addition, it is an object of the present invention to prevent the diffusion of an aluminum atom into a channel-forming region even when aluminum is used as the wiring material and allow good ohmic junction in an active matrix display device.

According to the present invention, an electrode (or a wiring) is formed with a two-layer structure including a first conductive layer as a lower layer and a second conductive layer as an upper layer. The first conductive layer is formed with metal having a high melting point (such as Ti or Mo) or metal nitride having a high melting point (such as TiN), and the second conductive layer is formed with aluminum or alloy containing aluminum. The electrode (or the wiring) having the two-layer structure has a cross-sectional shape in which the width (W1) of the first conductive layer is larger than the width (W2) of the second conductive layer. In other words, after forming a structure in which an end portion of the lower layer (the first conductive layer) is outer than an end portion of the upper layer (the second conductive layer), a transparent conductive film is formed so as to cover and contact the electrode (or the wiring) having the two-layer structure.

According to the present invention, the above problems are solved by connecting a transparent conductive film (typically ITO) with a part of the first conductive layer that is exposed without overlapping the second conductive layer in the electrode (or the wiring) including the two layers.

According to an aspect of the present invention, a semiconductor device whose example is shown in FIG. 1A or 2A comprises a transparent conductive film and a plurality of thin film transistors having a semiconductor thin film over a substrate having an insulating surface, wherein the semiconductor device further comprises an electrode or a wiring in which a first conductive layer in contact with the semiconductor thin film and a second conductive layer on the first conductive layer are stacked, wherein the first conductive layer has a larger width (W1 or W3) than the second conductive layer, wherein the transparent conductive film is in contact with a part of the first conductive layer that extends from an end portion of the second conductive layer.

According to another aspect of the present invention, a semiconductor device comprises a transparent conductive film and a plurality of thin film transistors having a semiconductor thin film over a substrate having an insulating surface, wherein the semiconductor device further comprises an electrode or a wiring in which a first conductive layer in contact with the semiconductor thin film and a second conductive layer on the first conductive layer are stacked, and wherein the transparent conductive film is in contact with a part of the first conductive layer that is projected from an end portion of the second conductive layer.

According to another aspect of the present invention, a semiconductor device comprises a transparent conductive film and a plurality of thin film transistors having a semiconductor thin film over a substrate having an insulating surface, wherein the semiconductor device further comprises an electrode or a wiring in which a first conductive layer in contact with the semiconductor thin film and a second conductive layer on the first conductive layer are stacked, wherein a side surface portion of the first conductive layer has a smaller tapered angle than a side surface portion of the second conductive film as shown in FIG. 1A, and wherein the transparent conductive film is in contact with the side surface portion of the first conductive layer.

According to another aspect of the present invention, a semiconductor device comprises, as shown in FIG. 3, a transparent conductive film and a plurality of thin film transistors having a semiconductor thin film over a substrate having an insulating surface, wherein the semiconductor device further comprises an electrode or a wiring in which a first conductive layer in contact with the semiconductor thin film and a second conductive layer on the first conductive layer are stacked, and a flattening insulating film formed over a part of the electrode or the wiring, wherein the transparent conductive film is formed over the flattening insulating film, wherein the electrode or the wiring is in contact with the transparent conductive film through a contact hole provided in the flattening insulating film, and wherein an end portion of the electrode or the wiring is located in the contact hole.

In each of the above structures, a surface of the second conductive layer is covered with an oxide film.

Further, a manufacturing method for achieving the above structures is also included in the present invention. According to a method shown below in which etching is conducted multiple times, a structure in which an end portion of the lower layer (the first conductive layer) is outer than an end portion of the upper layer (the second conductive layer) is achieved.

As a first method, after forming a mask over a metal multilayer film including two layers, a metal multilayer film pattern having a width W1 and a tapered end portion is formed by a first dry etching process. Subsequently, only the upper layer (a material containing aluminum) is anisotropically etched by a second dry etching process to narrow the width of the upper layer, thereby forming a width W2 which is smaller than W1 of the lower layer. As a result, an electrode (or a wiring) where a part of the lower layer not overlapping the upper layer is exposed is formed.

As a second method, after forming a mask over a metal multilayer film including two layers, only the upper layer (a material containing aluminum) is removed by etchant in accordance with the mask pattern. In this step, the end portion of the upper layer recedes from the end portion of the mask due to the wraparound of the etching. After that, only a part of the lower layer not covered with the mask is removed by a dry etching process. As a result, an electrode (or a wiring) where a part of the lower layer not overlapping the upper layer is exposed is formed.

As a third method, after forming a mask over a metal multilayer film including two layers, a metal multilayer film pattern is formed by a dry etching process. Subsequently, only the upper layer (a material containing aluminum) is processed by etchant, thereby narrowing the width of the upper layer. In this step, the end portion of the upper layer recedes from the end portion of the mask due to the wraparound of the etching. As a result, an electrode (or a wiring) where a part of the lower layer not overlapping the upper layer is exposed is fainted.

As a fourth method, after forming a first mask over a metal multilayer film including two layers, a metal multilayer film pattern is formed by a dry etching process or a wet etching process. Subsequently, after removing the first mask, a second mask is formed, and the metal multilayer film pattern is processed in accordance with the second mask pattern. In this step, the second mask pattern is made narrower than the first mask pattern. As a result, an electrode (or a wiring) where a part of the lower layer not overlapping the upper layer is exposed is formed.

In any one of the above methods, the electrode or the wiring is patterned by using a photomask through dry etching using a plasma apparatus or wet etching using etchant.

Then, a transparent conductive film is formed so as to cover and contact the electrode (or the wiring) obtained by the above method. As a result, the lower layer of the electrode (or the wiring) and the transparent conductive film are in contact with each other so that they are electrically connected to each other in this portion principally.

A structure in which the transparent conductive film and the lower layer are in contact at the end section of the lower layer has already been disclosed conventionally; however, in most of conventional structures, the transparent conductive film mainly contacts the top surface of the uppermost layer so that they are electrically connected to each other. Meanwhile, in the present invention, in order to electrically connect the lower layer and the transparent conductive film, a tapered portion having a smaller tapered angle than the upper layer or a portion projected from the end section of the upper layer is intentionally provided to secure the area where the lower layer and the transparent conductive film contact, so that the lower layer and the transparent conductive film completely contact with each other.

According to the present invention, since a thin oxide film is formed between the transparent conductive film and the upper layer formed with a material containing aluminum, the upper layer and the transparent conductive film are not directly connected, and they are electrically connected through the lower layer interposed therebetween. The structure of the present invention is greatly different in this point from conventional structures.

It is to be noted that a light-emitting element has an anode, a cathode, and a layer containing an organic compound which provides luminescence (Electro Luminescence) by applying an electric field thereto (this layer is hereinafter referred to as an EL layer). Luminescence from the organic compound includes light emitted when a singlet-excited state returns to a ground state (fluorescence) and light emitted when a triplet-excited state returns to the ground state (phosphorescence). In a light-emitting device manufactured by a film-forming apparatus and a film-forming method according to the present invention, either fluorescence or phosphorescence can be used.

Further, in this specification, a first electrode indicates an electrode serving as an anode or a cathode of the light-emitting element. The light-emitting element has a structure including the first electrode, a layer containing an organic compound over the first electrode, and a second electrode over the layer containing the organic compound. The electrode formed over a substrate first is referred to as the first electrode.

As arrangement of the first electrode, stripe arrangement, delta arrangement, mosaic arrangement, or the like can be used.

The light-emitting device in this specification indicates an image display device, a light-emitting device, or a light source (including an illumination device). Moreover, a module in which a connector, for example an FPC (Flexible Printed Circuit), a TAB (Tape Automated Bonding) tape, or a TCP (Tape Carrier Package) is attached to a light-emitting device, a module in which a printed wiring board is provided at a tip of a TAB tape or a TCP, and a module in which an IC (Integrated Circuit) is directly mounted in a light-emitting element by a COG (Chip On Glass) method are all included in the light-emitting device.

In the light-emitting device according to the present invention, the driving method of screen displaying is not particularly limited. For example, a point sequential driving method, a line sequential driving method, a plane sequential driving method, or the like may be used. Typically, the line sequential driving method is used, and a time division gradation driving method or an area division gradation driving method may be appropriately used. Further, a video signal to be inputted into a source line of the light-emitting device may be either an analog signal or a digital signal. A driver circuit and the like may be designed appropriately in accordance with the video signal.

In a light-emitting device in which a video signal is digital, the video signal, to be inputted into a pixel may use constant voltage (CV) or constant current (CC). When the video signal uses the constant voltage (CV), the voltage applied to the light-emitting element is constant (CVCV) or the current flowing through the light-emitting element is constant (CVCC). On the other hand, when the video signal uses the constant current (CC), the voltage applied to the light-emitting element is constant (CCCV) or the current flowing in the light-emitting element is constant (CCCC).

In the light-emitting display device according to the present invention, a protective circuit (such as a protective diode) may be provided to avoid electrostatic damage.

In the case of an active matrix type, a plurality of TFTs are provided so as to connect with the first electrode, and the present invention can be applied regardless of the TFT structure. For example, a top-gate TFT, a bottom-gate (inverted staggered) TFT, or a staggered TFT can be used. Not only a TFT of a single-gate structure but also a multi-gate TFT having a plurality of channel-forming regions, for example a double-gate TFT, may be used.

A TFT to be electrically connected with the light-emitting element may be either a p-channel TFT or an n-channel TFT. When the light-emitting element is connected with the p-channel TFT, the light-emitting element is connected with the anode. Concretely, after stacking a hole-injecting layer/a hole-transporting layer/a light-emitting layer/an electron-transporting layer sequentially over the anode, the cathode may be formed. When the light-emitting element is connected with the n-channel TFT, the light-emitting element is connected with the cathode. Concretely, after stacking an electron-transporting layer/a light-emitting layer/a hole-transporting layer/a hole-injecting layer sequentially over the cathode, the anode may be formed.

As a channel-forming region of the TFT, an amorphous semiconductor film, a semiconductor film including a crystal structure, a compound semiconductor film including an amorphous structure, or the like can be appropriately used. Further, as a channel-forming region of the TFT, a semi-amorphous semiconductor film (also referred to as a microcrystal semiconductor film) can also be used. The semi-amorphous semiconductor film has an intermediate structure between an amorphous structure and a crystal structure (including a single crystal and polycrystal) and has a third state which is stable in terms of free energy. The semi-amorphous semiconductor film also includes a crystalline region which has a short-range order and a lattice distortion.

In this specification, the pixel electrode indicates an electrode to be connected with a TFT and also indicates an electrode paired with an opposing electrode provided to an opposing substrate. Further, a liquid crystal element indicates the pixel electrode, the opposing electrode, and a liquid crystal layer provided between these electrodes. In an active matrix liquid crystal display device, a display pattern is formed on the screen by driving the pixel electrodes arranged in matrix. Specifically, the liquid crystal layer provided between the pixel electrode and the opposing electrode is optically modulated by applying voltage between the selected pixel electrode and the opposing electrode corresponding to the pixel electrode, and this optical modulation is recognized as a display pattern by an observer.

According to the present invention, the step of providing a layer containing metal having a high melting point as the upper layer of the wiring which has been conventionally required can be omitted without increasing the contact resistance between the electrode (or the wiring) and the pixel electrode. This provides advantages in that cost and time spent in the production can be reduced.

BRIEF DESCRIPTION OF DRAWINGS

In the accompanying drawings.

BEST MODE FOR CARRYING OUT THE INVENTION

Embodiment Modes of the present invention are hereinafter described.
[Embodiment Mode 1]
The present invention is described using an active matrix light-emitting device as an example in this embodiment mode.

Figure 1A:
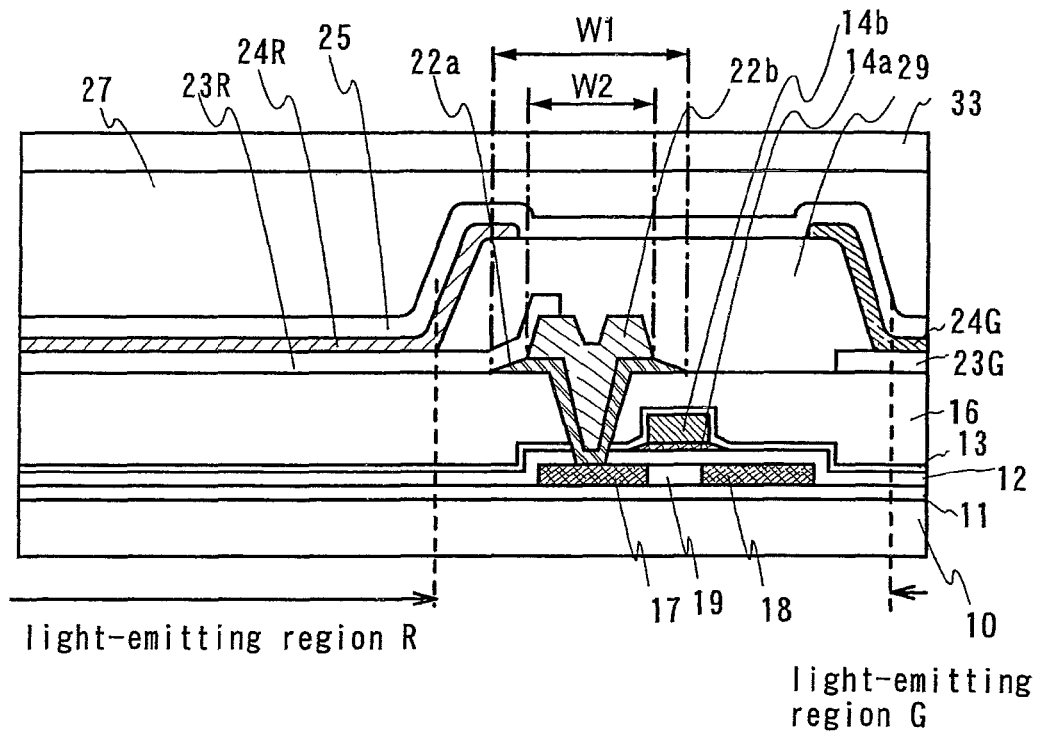
FIGS. 1A and 1B are cross-sectional views of a pixel showing Embodiment Mode 1.

FIG 1A is a magnified cross-sectional view showing a part of a pixel portion of a light-emitting device. Steps of manufacturing a semiconductor device having a light-emitting element shown in FIG 1A are shown below.

First, a base insulating film 11 is formed over a substrate 10. In the case of extracting light assuming that the side of the substrate 10 is a display surface, a glass substrate or a quartz substrate having light-transmitting properties is preferably used as the substrate 10. Moreover, a plastic substrate which has light-transmitting properties and which can resist the process temperature may be used. Meanwhile, in the case of extracting light assuming that a plane opposite to the side of the substrate 10 is a display surface, a silicon substrate, a metal substrate, or a stainless steel substrate each having an insulating film formed thereover may be used besides the above-mentioned substrates. Here, a glass substrate is used as the substrate 10. It is to be noted that the glass substrate has a refractive index of approximately 1.55.

As the base insulating film 11, a base film including an insulating film such as a silicon oxide film, a silicon nitride film, or a silicon oxynitride film is formed. Although an example of using a two-layer structure is shown as the base film here, the base film may have a single-layer structure or a multilayer structure in which two or more layers are stacked. It is to be noted that the base insulating film is not necessarily formed.

Subsequently, a semiconductor layer is formed over the base insulating film. The semiconductor layer is formed in such a way that after forming a semiconductor film having an amorphous structure by a known means (a sputtering method, an LPCVD method, a plasma CVD method, or the like), the semiconductor film is crystallized so as to be a crystalline semiconductor film by a known crystallization process (a laser crystallization method, a thermal crystallization method, a thermal crystallization method using a catalyst such as nickel, or the like), and then the crystalline semiconductor film is patterned into a desired shape using a first photomask. The thickness of the semiconductor layer is set in the range of 25 to 80 nm (preferably 30 to 70 nm). Although the material of the crystalline semiconductor film is not limited in particular, it is preferable to use silicon or silicon germanium (SiGe) alloy.

In the crystallization process of the semiconductor film having the amorphous structure, a continuous wave laser may be used. In order to obtain a crystal having a large grain size by crystallizing the amorphous semiconductor film, it is preferable to use any one of second to fourth harmonics of a fundamental wave emitted from a continuous wave solid-state laser. Typically, the second ha monies (532 nm) or the third harmonics (355 nm) of a Nd:YVO$_4$ laser (fundamental wave 1064 nm) is preferably used. In the case of using the continuous wave laser, a laser beam emitted from a continuous wave YVO$_4$ laser is driven by 10 W is converted into a harmonics by a non-linear optical element. The harmonics can also be obtained by putting a YVO$_4$ crystal and a non-linear optical element in the resonator. It is preferable to shape the laser beam into a rectangular or elliptical laser beam on an irradiation surface by an optical system and then deliver the laser beam to an object. The energy density here is required to be in the range of approximately 0.01 to 100 MW/cm$^2$ (preferably 0.1 to 10 MW/cm$^2$). Then, the semiconductor film is preferably moved at a speed of approximately 10 to 2000 cm/s relative to the laser beam.

Next, after removing the resist mask, a gate insulating film 12 is formed so as to cover the semiconductor layer. The gate insulating film 12 is formed in thicknesses from 1 to 200 nm by a plasma CVD method or a sputtering method.

Next, a conductive film having thicknesses from 100 to 600 nm is formed over the gate insulating film 12. Here, a conductive film is formed with multilayer including a TaN film and a W film by a sputtering method. Although the conductive film is formed with the multilayer including the TaN film and the W film here, the structure is not limited in particular. A single layer or multilayer containing an element selected from Ta, W, Ti, Mo, Al, and Cu or an alloy material or a compound material containing the above element as its main component may be formed. Alternatively, a semiconductor film typified by a poly-crystalline silicon film doped with an impurity element such as phosphorus may be used.

Next, a resist mask is formed using a second photomask. Etching is conducted by a dry etching method or a wet etching method. Through this etching step, the conductive film is etched, thereby obtaining conductive layers 14a and 14b. These conductive layers 14a and 14b serve as a gate electrode of a TFT.

Next, after removing the resist mask, a resist mask is newly formed using a third photomask. A first doping step is conducted to dope the semiconductor with an impurity element imparting n-type conductivity (typically, phosphorus or arsenic) at low concentration so that an n-channel TFT (not shown) is formed. The resist mask covers a region to be a p-channel TFT and a vicinity of the conductive layer. The first doping step is conducted through an insulating film, thereby forming a low-concentration impurity region. One light-emitting element is driven by a plurality of TFTs, and when only p-channel TFTs are used to drive, the above doping step is not necessary in particular.

Subsequently, after removing the resist mask, a resist mask is newly formed using fourth photomask. A second doping step is conducted in order to dope the semiconductor with an impurity element imparting p-type conductivity (typically boron) at high concentration. The second doping step is conducted through the gate insulating film 12, thereby forming p-type high-concentration impurity regions 17 and 18.

Next, a resist mask is newly formed using a fifth mask. A third doping step is conducted to dope the semiconductor with an impurity element imparting n-type conductivity (typically, phosphorus or arsenic) at high concentration so that an n-channel TFT (not shown) is formed. The third doping step is conducted by an ion doping method under a condition where the dose ranges from $1 \times 10^{13}$ to $5 \times 10^{15}/cm^2$ and the accelerating voltage ranges from 60 to 100 keV. The resist mask covers a region to be a p-channel TFT and a vicinity of the conductive layer. The third doping step is conducted through the gate insulating film 12, thereby forming n-type high-concentration impurity regions.

After that, the resist mask is removed and then a first interlayer insulating film 13 containing hydrogen is formed. Subsequently, activation of the impurity element added in the semiconductor layer and hydrogenation are conducted. As the first interlayer insulating film 13 containing hydrogen, a silicon nitride oxide film (SiNO film) obtained by a PCVD method is used. In addition, when a metal element for inducing crystallization, typically nickel, is used to crystallize the semiconductor film, gettering to reduce nickel in a channel-forming region 19 can be conducted at the same time as the activation.

Next, a flattening insulating film 16 to be a second interlayer insulating film is formed. As the flattening insulating film 16, an insulating film whose skeletal structure includes a bond of silicon (Si) and oxygen (O) obtained by a coating method is used.

Next, etching is conducted using a sixth mask to form a contact hole in the flattening insulating film 16. At the same time, a part of the flattening insulating film at a periphery of the substrate is removed. Here, the etching is conducted under a condition where the selective ratio between the first interlayer insulating film 13 and the flattening insulating film 16 is different. Although the etching gas to be used is not limited, $CF_4$, $O_2$, He, and Ar are appropriate. The dry etching is conducted under a condition where the RF power is 3000 W, the pressure is 25 Pa, and the flow rates of $CF_4$, $O_2$, He, and Ar are 380 sccm, 290 sccm, 500 sccm, and 500 sccm respectively. In order to etch so as not to leave residue on the first interlayer insulating film 13, the etching time is preferably increased for approximately 10 to 20%. The flattening insulating film 16 may be tapered by conducting etching once or multiple times. Here, the dry etching is conducted twice, and the second dry etching is conducted under a condition where the RF power is 3000 W, the pressure is 25 Pa, and the flow rates of $CF_4$, $O_2$, and He are 550 sccm, 450 sccm, and 350 sccm respectively. It is desirable that the end portion of the flattening insulating film have a tapered angle θ more than 30° and less than 75°.

Next, etching is conducted using the sixth mask again, thereby selectively removing the exposed parts of the gate insulating film 12 and the first interlayer insulating film 13. Specifically, the gate insulating film 12 and the first interlayer insulating film 13 are etched using $CHF_3$ and Ar as etching gas. In order to conduct the etching so as not to leave residue over the semiconductor layer, the etching time is preferably increased for approximately 10 to 20%.

Next, the sixth mask is removed, and then a conductive film having a two-layer structure which contacts the semiconductor layer in the contact hole is formed. A first conductive layer 22a to be a lower layer is fowled with metal having a high melting point (such as Ti or Mo) or a metal compound having a high melting point (such as TiN). The film thickness of the first conductive layer 22a ranges from 20 to 200 nm. The first conductive layer 22a to be the lower layer has an advantage of preventing the interactive diffusion of silicon and aluminum.

Further, a second conductive layer 22b to be an upper layer is formed with low-resistant metal (typically Al) in order to decrease the electric resistance of the wiring. The film thickness of the second conductive layer 22b ranges from 0.1 to 2 μm. It is preferable to form these two layers continuously in the same sputtering apparatus so that the surface of each layer is not oxidized.

Next, first etching is conducted using a seventh mask. The first etching is conducted so that the upper layer is patterned to have a width W1. The first etching is conducted by a dry etching method or a wet etching method.

Next, as the resist mask remains, second etching is conducted by an ICP (Inductively Coupled Plasma) etching method to etch the second conductive layer to have a width W2 while making the resist mask recede. By the second etching, the first conductive layer is also removed slightly, thereby forming a tapered portion. By employing the ICP etching method, the film can be etched into a desired tapered shape when the etching condition (the electric power applied to a coil electrode, the electric power applied to an electrode on a substrate side, the electrode temperature on the substrate side, and so on) is appropriately adjusted. As the etching gas, chlorine-based gas typified by $Cl_2$, $BCl_3$, $SiCl_4$, or $CCl_4$, fluorine-based gas typified by $CF_4$, $SF_6$, or $NF_3$, or $O_2$ can be appropriately used.

Further, when the tapered shape is formed by the ICP etching method, projecting portions are formed equally at opposite sides of the electrode. Depending on the second etching condition, a part of the flattening insulating film 16 that is exposed by etching the first conductive layer may also be slightly etched.

Next, a transparent conductive film is Ruined in contact with the electrode or the wiring having the above two-layer structure. When the transparent conductive film and the first conductive layer 22a are formed so as to be in direct contact with each other, good ohmic junction can be obtained. Then, etching is conducted using an eighth mask, thereby forming first electrodes 23R and 236, which are anodes (or cathodes) of organic light-emitting elements.

As the material for the first electrode, ITO (indium tin oxide) or ITSO(indium tin oxide containing silicon oxide obtained by a sputtering method using a target of ITO which contains silicon oxide by 2 to 10 wt %) is used. In addition to ITSO, a transparent conductive film such as a light-transmitting conductive oxide film (IZO), which is indium oxide containing silicon oxide in which zinc oxide (ZnO) is mixed by 2 to 20% may be used. Further, a transparent conductive film of ATO (antimony tin oxide) containing silicon oxide may be used.

If ITO is used as the first electrodes 23R and 236, bake for crystallization is conducted to decrease the electric resistance. ITSO and IZO, even after conducting bake, are not crystallized like ITO and remain to be amorphous.

In order to compare the contact resistance between ITSO and the electrode of the two layers obtained by the above method and the contact resistance in a comparative example, the following experiment is carried out.

A silicon oxide film is formed over a glass substrate as an insulating layer. Then, a metal layer having a two-layer structure is formed by continuously stacking a pure aluminum layer (having a thickness of 700 nm and a resistivity of 4 μΩcm) on a titanium layer (of 100 nm thick) by a sputtering method. After that, a resist mask having an electrode pattern is formed by photolithography, and two samples are formed by etching the metal layer having the two-layer structure by the following three methods.

In a sample 1 (comparative example), both of the two layers of the metal layer are etched only by conducting plasma etching once with the use of an ICP apparatus. As a result, an end section of the formed electrode has a tapered angle of approximately 80° which is almost perpendicular. After that, an ITSO film to be a transparent electrode is formed by a sputtering method, and then patterned through photolithography.

In a sample 2 (the present invention), the metal layer having the two-layer structure is etched by conducting plasma etching in two steps with the use of an ICP apparatus, thereby obtaining a shape in which the titanium layer as the lower layer is projected. Specifically, first etching is conducted so that the end section of the etched electrode has a tapered angle of approximately 60° and second etching different from the first etching condition is conducted so that the aluminum layer as the upper layer is selectively etched and the end section becomes almost perpendicular.

The first etching is conducted for 100 seconds under a first condition where $BCl_3$ and $Cl_2$ are used as the etching gas, the flow rate of $BCl_3$ and $Cl_2$ is 60/20 (sccm), the pressure is 1.9 Pa, and an RF (13.56 MHz) electric power of 450 W is applied to the coil-shaped electrode to generate plasma. An RF (13.56 MHz) electric power of 100 W is also applied to the substrate side (sample stage) to apply substantially negative bias voltage. The electrode on the substrate side has an area of 12.5 cm×12.5 cm and the coil-shaped electrode (here a quartz circular plate on which a coil is provided) is a circular plate having a diameter of 25 cm. Next, the etching is conducted for 160 seconds under a second condition where the etching gas and the flow rate are the same as those in the first condition, the pressure is 1.2 Pa, and an RF electric power of 600 W is applied to the coil-shaped electrode and an RF electric power of 250 W is applied to the substrate side to generate plasma.

A condition of the second etching is that $BCl_3$ and $Cl_2$ are used as the etching gas with the gas flow rate of 40/40 (sccm), the pressure is 3.5 Pa, an RF electric power of 200 W is applied to the coil-shaped electrode and an RF electric power of 50 W is applied to the substrate side to generate plasma, and the etching time is 60 seconds.

Figure 4A:
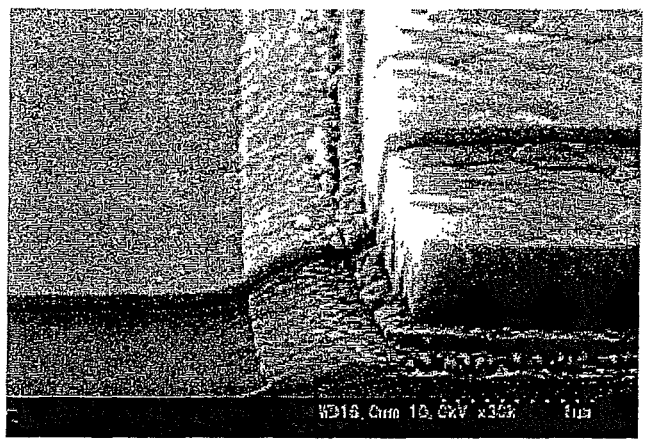
FIGS. 4A and 4B are SEM photographs and FIG. 4C is a perspective view, all of which show an end portion of an etched electrode.
Figure 4B:
Figure 4C:
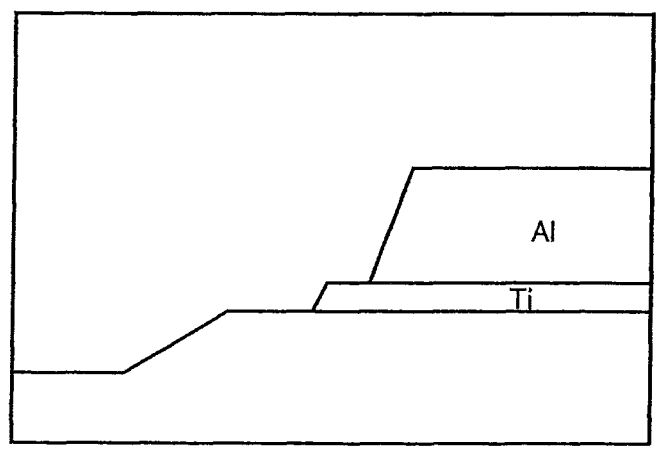

FIGS. 4A and 4B are SEM (scanning electron microscope) photographs after the etching, and FIG. 4C is a schematic cross-sectional view. FIG. 4A is a perspective view, and FIG. 4B is a cross-sectional view. The length of the projected portion is 0.22 μm. In other words, the end portion of the upper layer and the end portion of the lower layer are 0.22 μm apart, and the width W1 of the lower layer is 0.44 μm larger than the width W2 of the upper layer. After that, an ITSO film to be a transparent electrode is formed by a sputtering method and patterned through photolithography.

In each of the two samples, two kinds of TEG (test element group) patterns are formed for electric resistance measurement.

Figure 5A:
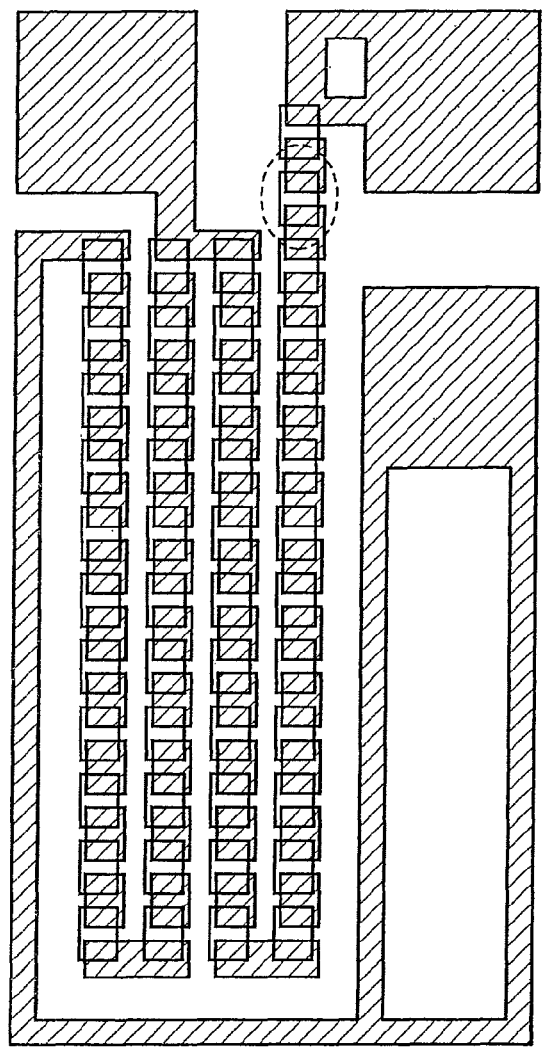
FIGS. 5A and 5B show a first TEG pattern.
Figure 5B:
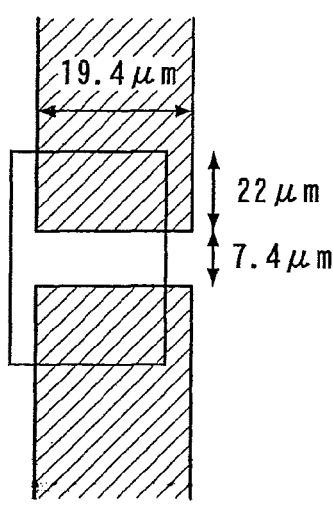
Figure 6A:
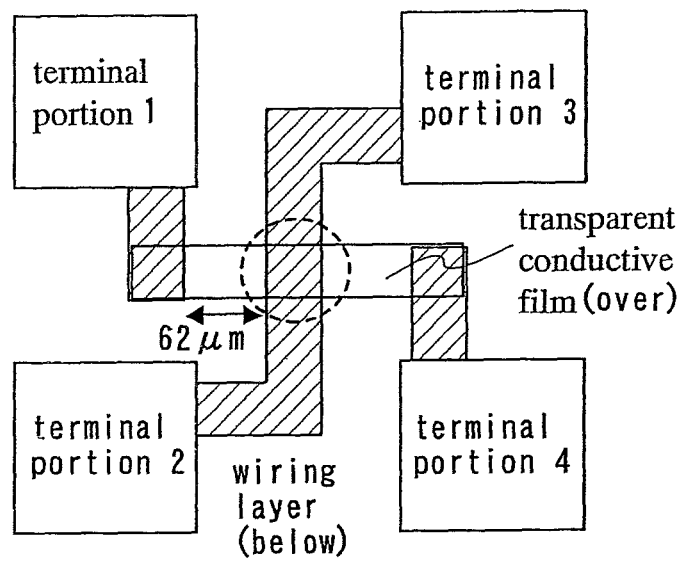
FIGS. 6A and 6B show a second TEG pattern.
Figure 6B:
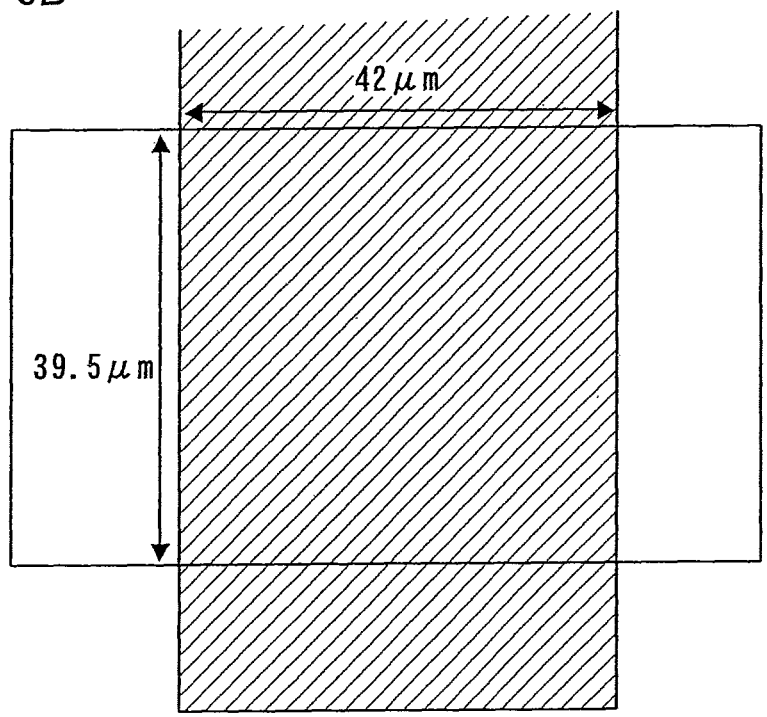

One of the TEG patterns is a first TEG pattern (FIG. 5A shows a top-surface layout, and FIG. 6B shows a relation of measured value in the magnified contact portion) referred to as a contact chain in which the metal layer and the ITSO layer are arranged alternately so as to be serially connected. In the first TEG pattern, three resistance elements of the wiring, the ITO, and the interface therebetween are serially connected.

The other pattern is a second TEG pattern (FIG. 6A shows a top-surface layout and FIG. 6B shows a relation of the measured values in the magnified contact portion) in which the metal layer and the ITSO layer crisscross with each other for Kelvin measurement.

Next, the electric resistance is measured using the first TEG patterns on the two samples. As a result, the resistance value (per one contact) at 1 V in the sample 2 (the present invention) is 77% lower than that in the sample 1 (comparative example).

Figure 7:
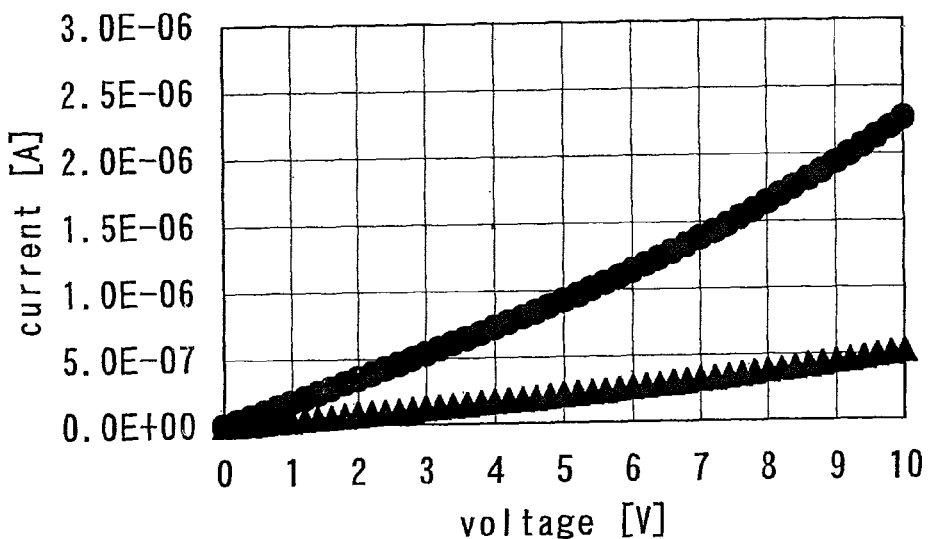
FIG. 7 is a graph showing a result of electric measurement using the first TEG pattern (an experiment result of multilayer including titanium and aluminum)

Further, FIG. 7 shows a result of measuring the electric resistance of the first TEG. It is to be noted that the resistivity of ITSO is assumed to be 4000 μΩcm.

Figure 8:
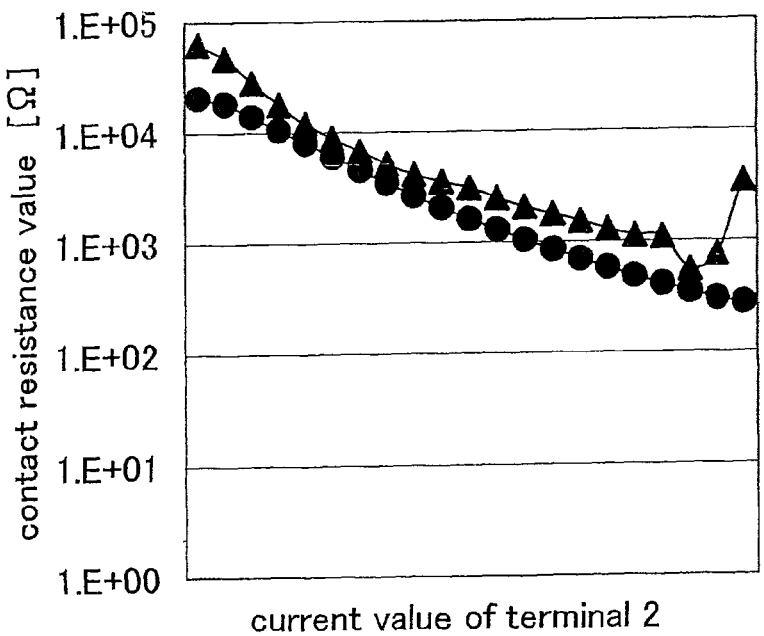
FIG. 8 is a graph showing a result of electric measurement using the second TEG pattern.

Moreover, the electric resistance is measured using the second TEG patterns on the two samples. The contact resistance value is lower in the sample 2 (the present invention) than in the sample 1 (comparative example). FIG. 8 shows a result of the electric resistance measurement on the second TEG pattern.

It is to be understood from the above experiments that the contact resistance with ITSO can be decreased by using the electrode of the two-layer structure in which the lower layer (titanium layer) is projected.

Figure 15:
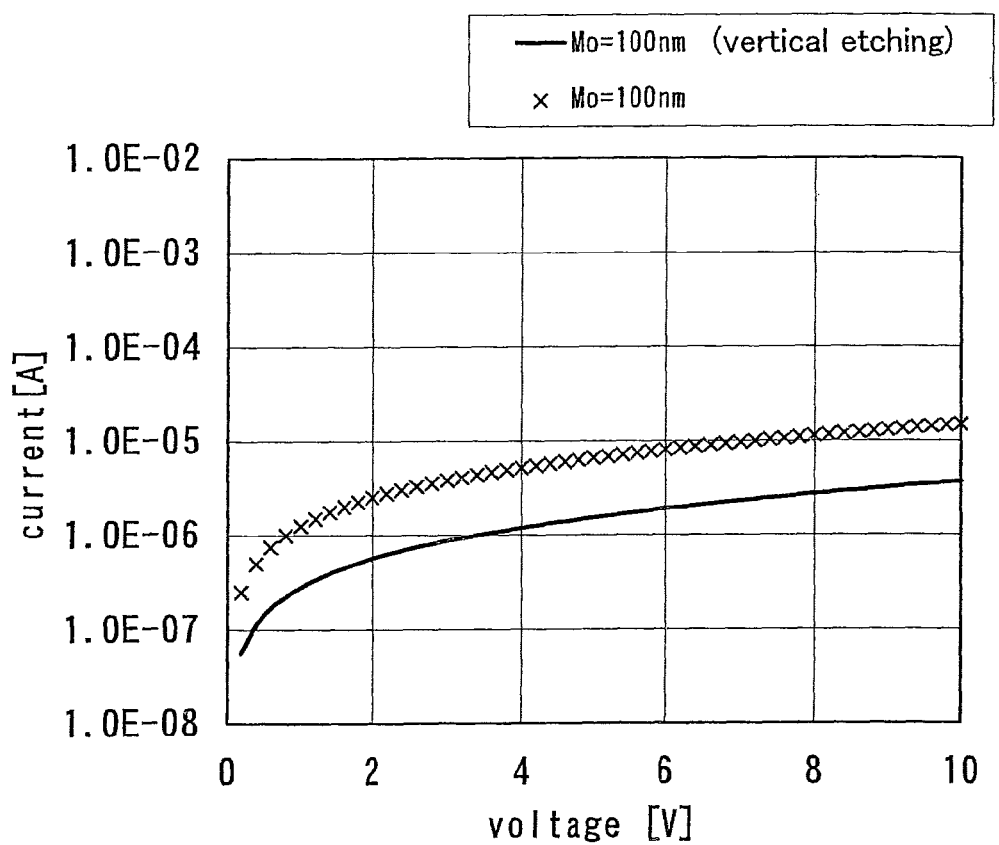
FIG. 15 is a graph showing a result of electric measurement using the first TEG pattern (an experiment result of multilayer including molybdenum and aluminum).

FIG. 15 shows a result of the electric resistance measurement on the first TEG pattern using a molybdenum layer (of 100 nm thick) instead of the lower layer (titanium layer). It is to be noted that the resistivity of ITSO is assumed to be 4000 μΩcm. In FIG. 15, a solid line shows a comparative sample which is etched under a condition for making the end section of the molybdenum layer serving as the lower layer almost vertical. Further, in FIG. 15, the sample in which the molybdenum layer serving as the lower layer is projected and the end section has a tapered angle of approximately 60° is illustrated as x marks. It is also understood from FIG. 15 that the contact resistance with ITSO can be decreased by using the electrode having the two-layer structure in which the lower layer (molybdenum layer) is projected.

Moreover, the electric resistance is measured in the same way under different conditions of the thickness of the lower layer: 100 nm, 200 nm, and 300 nm. Then, it has been confirmed that the contact resistance value gets lower as the lower layer is thicker.

Figure 1B:
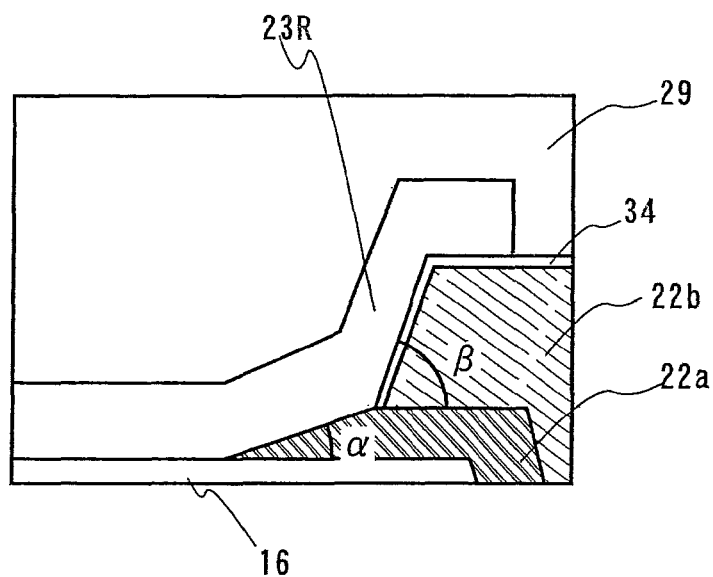

Further, FIG. 1B is a magnified cross-sectional view showing a part where the first electrode formed with a transparent conductive film and the lower layer formed with Ti are in contact. As shown in FIG. 1B, an aluminum oxide film 34 is formed thinly on the surface of the second conductive layer 22b to be the upper layer, and the first electrode formed with the transparent conductive film is electrically bonded with only the lower layer. FIG. 1B shows an example in which a tapered angle a of the end portion of the lower layer 22a is smaller than a tapered angle β of the end portion of the second conductive layer 22b to be the upper layer. The area where the first electrode and the first conductive layer contact increases as the tapered angle β of the end portion of the first conductive layer 22a to be the lower layer is smaller.

Subsequently, an insulator 29 (referred to as a bank, a partition wall, a barrier, an embankment, or the like) is formed to cover the end portions of the first electrodes 23R and 23G using the eighth mask. As the insulator 29, an organic resin film obtained by a coating method or an SOG film (such as a $SiO_x$ film containing an alkyl group) is formed in thicknesses from 0.8 to 1 μm.

Next, layers 24R and 24G each containing an organic compound are stacked by an evaporation method or a coating method. In addition, it is desirable to conduct vacuum heating for degassing in order to improve the reliability before forming the layers 24R and 24G containing the organic compound. For example, it is desirable to conduct heat treatment at 200 to 300° C. under a low-pressure atmosphere or an inert atmosphere to remove the gas contained in the substrate before evaporating the organic compound materials. The layers 24R and 24G containing the organic compound are formed by an evaporation method in a film-forming chamber which is evacuated so as to have a degree of vacuum at $5\times10^{-3}$ Torr (0.665 Pa) or less, preferably in the range of $10^{-4}$ to $10^{-6}$ Torr. At the evaporation, the organic compound is vaporized in advance by resistance heating, and the vaporized organic compound spatters toward the substrate by opening the shutter. The vaporized organic compound spatters upward and goes through an opening portion provided to a metal mask, and then is deposited onto the substrate.

In order to achieve a full color, the mask is aligned for each of the emission colors (R, G, and B).

The layers 24R and 24G containing the organic compound are multilayer formed by stacking a hole-injecting layer/a hole-transporting layer/a light-emitting layer/an electron-transporting layer sequentially over the first electrode. For example, $Alq_3$ doped with DCM is formed in 40 nm thick as a light-emitting layer in the layer 24R containing the organic compound. Moreover, $Alq_3$ doped with DMQD is formed in 40 nm thick as a light-emitting layer in the layer 24G containing the organic compound. Although not illustrated here, PPD (4,4'-bis(N-(9-phenanthryl)-N-phenylamino)biphenyl) doped with CBP (4,4'-bis(N-carbazolyl)-biphenyl) is formed in 30 nm thick as a blue light-emitting layer, and SAlq (bis (2-methyl-8-quinolinolate)(triphenylsilanolato)aluminum) is formed in 10 nm thick as a blocking layer.

Next, a second electrode 25, that is, a cathode (or an anode) of the organic light-emitting element is formed. As the material of the second electrode 25, alloy such as MgAg, MgIn, or AlLi, $CaF_2$, CaN, or a film formed by co-evaporating aluminum and an element belonging to the first or second group in the periodic table may be used.

Before forming the second electrode 25, a light-transmitting layer may be formed with $CaF_2$, $MgF_2$, or $BaF_2$ as a cathode buffer layer in thicknesses from 1 to 5 nm.

Moreover, a protective layer for protecting the second electrode 25 may be formed.

Subsequently, the light-emitting element is sealed by pasting a sealing substrate 33 with a sealing material (not shown). Dry inert gas or a transparent filling material fills a region 27 surrounded by a pair of substrates and the sealing material. As the inert gas, noble gas or nitrogen can be used, and a dry agent for drying is provided to the seal substrate 33. As the filling material, any material can be used as long as the material has light-transmitting properties. Typically, ultraviolet curable or thermosetting epoxy resin may be used. When the filling material fills the space between the pair of substrates, the transmittance of the whole can be increased.

When the first electrode is formed with a transparent material and the second electrode is formed with a metal material, a structure in which light is extracted through the substrate 10, which is a so-called bottom-emission type, is obtained. Further, when the first electrode is formed with a metal material and the second electrode is formed with a transparent material, a structure in which light is extracted through the sealing substrate 33, which is a so-called top-emission type, is obtained. Furthermore, when the first electrode and the second electrode are formed with a transparent material, a structure in which light is extracted from both of the substrate 10 and the sealing substrate 33 can be obtained. The present invention may employ any one of the above structures appropriately.

The layers through which light emitted from the light-emitting layer passes when light is extracted through the substrate 10, which are the first electrode, the first interlayer insulating film 13, the second interlayer insulating film 16, the gate insulating film 12, and the base insulating film 11, all include silicon oxide (refractive index approximately 1.46); therefore, the difference of the refractive index is small, thereby increasing the light extraction efficiency. That is to say, stray light between the layers formed with the materials having different refractive indexes can be suppressed.

[Embodiment 2]

Here, an example in which an electrode having a two-layer structure whose shape is different from that in Embodiment Mode 1 is hereinafter described with reference to FIGS. 2A and 2B.

Since the steps except the step of forming an electrode including a first conducive layer 222a and a second conductive layer 222b are the same as those in Embodiment Mode 1, the detailed description is omitted here. Therefore, in FIGS. 2A and 2B, the same part as that in FIG. 1A is denoted with the same reference numeral.

A conductive film including a two-layer structure in contact with the semiconductor layer in the contact hole is formed in accordance with Embodiment Mode 1. The first conductive layer 222a to be a lower layer is fondled with metal having a high melting point (such as Ti or Mo) or a metal compound having a high melting point (such as TiN) in thicknesses from 20 to 200 nm The first conductive layer 222a to be the lower layer has an advantage of preventing the interactive diffusion of silicon and aluminum.

The second conductive layer 222b to be an upper layer is formed with low-resistant metal (typically Al) in thicknesses from 0.1 to 2 μm in order to lower the electric resistance of the wiring. It is preferable to form these two layers continuously in the same sputtering apparatus so that the surface of each layer is not oxidized.

Next, first etching is conducted using the seventh mask. By the first etching, the upper layer is patterned so as to have a width W4. The first etching is conducted by a dry etching method or a wet etching method.

Next, second etching is conducted using the eighth mask. By the second etching, the lower layer is patterned so as to have a width W3. The second etching is conducted by a dry etching method or a wet etching method.

At the first and second etching, the width W4 of the upper layer is determined by the seventh mask, and the width W3 of the lower layer is determined by the eighth mask.

Next, in the same way as Embodiment Mode 1, a transparent conductive film is formed in contact with the electrode or the wiring having the two-layer structure. When the transparent conductive film and the first conductive layer 222a are formed so as to be in direct contact with each other, good ohmic junction can be obtained. Then, etching is conducted using a ninth mask, thereby forming first electrodes 23R and 23G which are anodes (or cathodes) of organic light-emitting elements.

The following steps are the same as those in Embodiment Mode 1; therefore, the detailed description is omitted here.

Figure 2A:
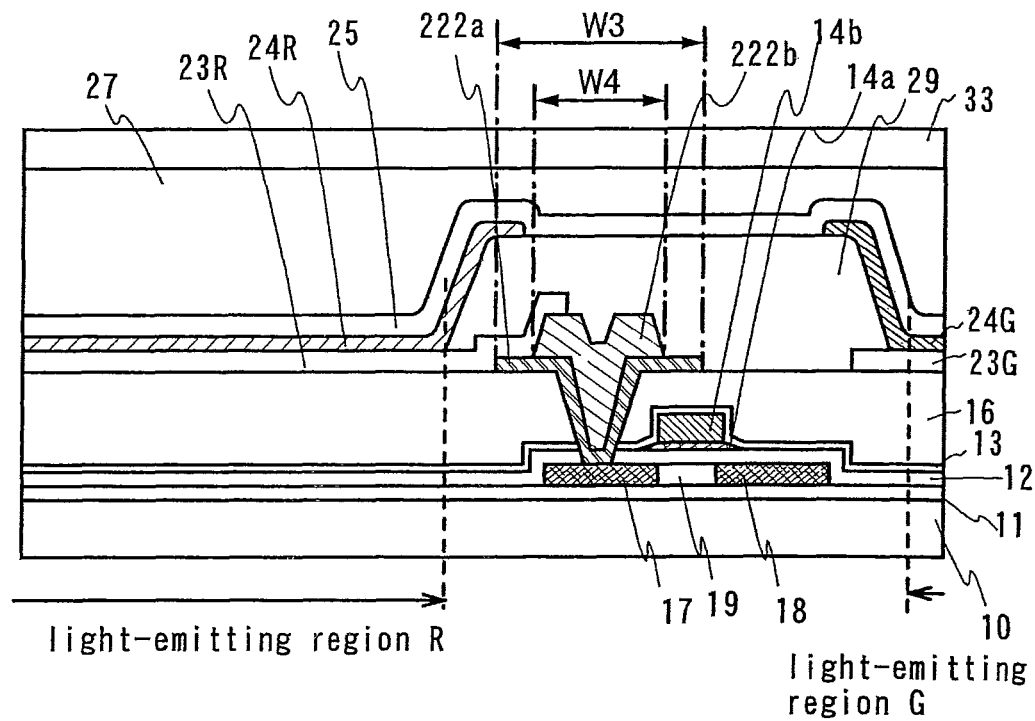
FIGS. 2A and 2B are cross-sectional views of a pixel showing Embodiment Mode 2.

Here, the example of obtaining the electrode structure shown in FIG. 2A by patterning twice to form the projected portion is shown. In the case of patterning twice, the projected portions can be formed equally at the opposite sides of the upper layer as shown in Embodiment Mode 1 and the projected portion can also be formed only at the portion that overlaps the first electrode to be formed afterward. In other words, the size of the area where the first electrode and the lower layer contact can be controlled by appropriately designing the two patterning masks.

Figure 2B:
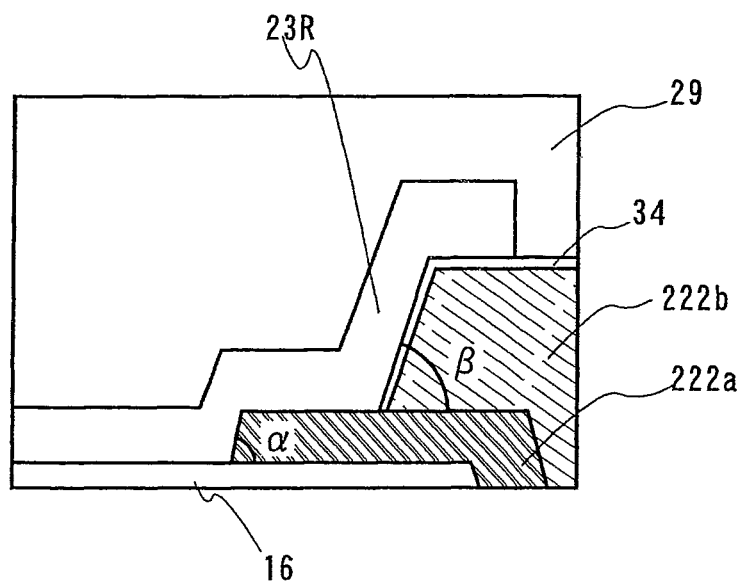

FIG. 2B is a magnified cross-sectional view showing a portion where the first electrode formed with the transparent conductive film and the lower layer formed with Ti are in contact. As shown in FIG. 2B, an aluminum film 34 is thinly formed on the surface of the second conductive layer 222b, and the first electrode formed with the transparent conductive film is electrically bonded with only the lower layer. In FIG. 2B, a tapered angle $\alpha$ of the end portion of the first conductive layer 222a to be the lower layer is larger than a tapered angle $\beta$ of the end portion of the second conductive layer 222b. As shown in FIG. 2B, the top surface portion and the end section of the lower layer are electrically connected with the first electrode. The area where the first electrode is in contact with the end section of the lower layer is larger than the area where the first electrode is in contact with the top surface of the lower layer.

This embodiment mode can be freely combined with Embodiment Mode 1.

[Embodiment Mode 3]

An example of providing one more insulating film between a transparent conductive film and an electrode having a two-layer structure is hereinafter described with reference to FIG. 3.

Since the steps up to forming an electrode including a first conductive layer 22a, a second conductive layer 22b are the same as those in Embodiment Mode 1, the detailed description is omitted. Further, in FIG. 3, the same part as that in FIG. 1A is denoted with the same reference numeral.

First, the electrodes 22a and 22b having the two-layer structure are formed in accordance with the step shown in Embodiment Mode 1. Next, a flattening insulating film 320 to be a third interlayer insulating film is formed. As the flattening insulating film 320, an insulating film whose skeletal structure includes a bond of silicon (Si) and oxygen (O) obtained by a coating method is used. Here, the third flattening insulating film 320 is used for flattening, the flattening insulating film 16 is not necessarily flat, and for example, an inorganic insulating film formed by a PCVD method may be used.

Next, the flattening insulating film 320 is selectively etched, thereby forming a contact hole that reaches the second conductive layer 22b to be the upper layer and the flattening insulating film 16. Subsequently, the transparent conductive film is formed and patterned to foul first electrodes 323R and 323G.

Next, an insulator 329 covering end portions of the first electrodes 323R and 323G is formed in the same way as the step shown in Embodiment Mode 1. Since the following steps are the same as those in Embodiment Mode 1, the detailed description is omitted here.

Figure 3:
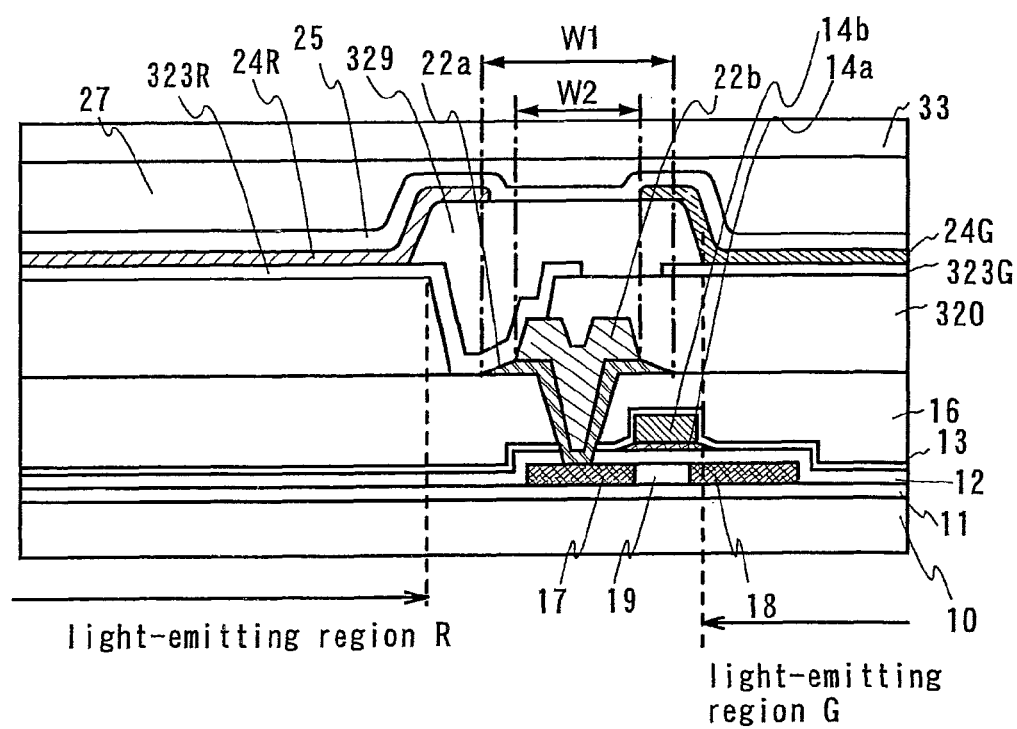
FIG. 3 is a cross-sectional view of a pixel showing Embodiment Mode 3.

By having the structure shown in FIG. 3, the area of the first electrode can be expanded and the light-emitting region can be expanded.

This embodiment mode can be freely combined with Embodiment Mode 1 or Embodiment Mode 2.

The present invention having the above structure is described in more detail with reference to Embodiments shown below.

[Embodiment 1]

Figure 9:
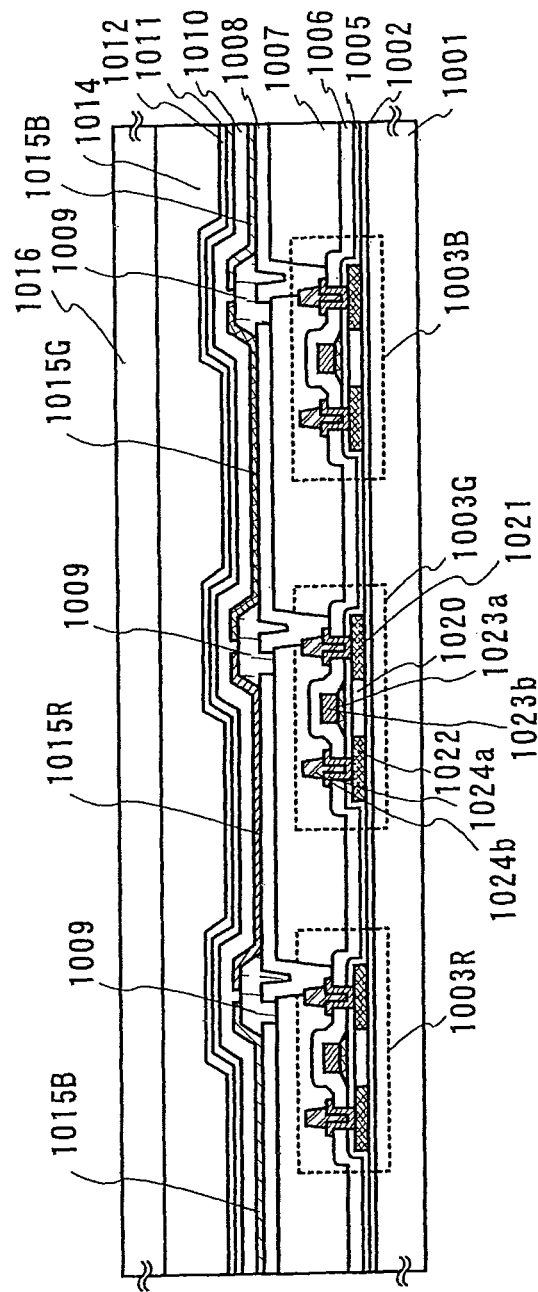
FIG. 9 is a cross-sectional view of an EL display panel (Embodiment 1)

This embodiment describes a full-color light-emitting device with reference to FIG. 9 which shows a cross section of a part of an active matrix light-emitting device.

Three TFTs 1003R, 1003G, and 1003B are provided over a first substrate 1001 where a base insulating film 1002 is provided. These TFTs are p-channel TFTs each having a channel-forming region 1020, source or drain regions 1021 and 1022, a gate insulating film 1005, and a gate electrode. The gate electrode has two layers of a tapered lower layer 1023a of the gate electrode and an upper layer 1023b of the gate electrode.

Further, an interlayer insulating film 1006 is an inorganic insulating film. A flattening insulating film 1007 covering the interlayer insulating film 1006 is a flat interlayer insulating film formed by a coating method.

In a light-emitting element, it is significant that the first electrode is flat. If the flattening insulating film 1007 is not flat, there is a risk that the first electrode does not become flat due to the effect of the surface unevenness of the flattening insulating film 1007. Therefore, the flatness of the flattening insulating film 1007 is significant.

Further, drain or source wirings 1024a and 1024b of a TFT have a two-layer structure. In a portion to connect with the transparent conductive film later, the lower layer 1024a of the drain or source wiring has a larger width than the upper layer 1024b of the drain or source wiring. This electrode shape is obtained by patterning twice to form the projected portion in accordance with Embodiment Mode 2. Here, the lower layer 1024a of the drain or source wiring is formed with a titanium film and the upper layer 1024b of the drain or source wiring is formed with an aluminum film. The upper layer 1024b of the drain or source wiring of the TFT is preferably tapered in consideration of the coverage of the interlayer insulating film.

The side surface of the lower layer may have a smaller tapered angle than the side surface of the upper layer in accordance with Embodiment Mode 1.

Further, a partition wall 1009 is formed with resin and serves as a partition between the layers containing the organic compound showing different light emission. Therefore, the partition wall 1009 has a grating shape so as to surround one pixel, that is, a light-emitting region. Although the layers containing the organic compound showing the different light emission may overlap on the partition wall, the layers should not overlap the first electrode of the adjacent pixel.

The light-emitting element includes a first electrode 1008 containing a transparent conductive material, layers 1015R, 1015G, and 1015B each containing an organic compound, and a second electrode 1010. In this embodiment, the first electrode 1008 is in contact with the lower electrode 1024a so that they are electrically connected.

Further, the materials of the first electrode 1008 and the second electrode 1010 need to be selected in consideration of the work function. However, the first electrode and the second electrode can be either an anode or a cathode. When the polarity of a driver TFT is a p-channel type, the first electrode is preferably an anode and the second electrode is preferably a cathode. Further, when the polarity of a driver TFT is an n-channel type, the first electrode is preferably a cathode and the second electrode is preferably an anode.

Moreover, the layers 1015R, 1015G, and 1015B containing the organic compound are formed by stacking Hilt (hole-injecting layer), HTL (hole-transporting layer), EML (light-emitting layer), ETL (electron-transporting layer), and EIL (electron-injecting layer) in order from the side of the first electrode (anode). The layer containing the organic compound can have, in addition to the multilayer structure, a single-layer structure or a mixed structure. To achieve full color, the layers 1015R, 1015G, and 1015B containing the organic compound are formed selectively to form three kinds of pixels of R, G, and B.

Further, it is preferable to provide protective films 1011 and 1012 covering the second electrode 1010 in order to protect the light-emitting element from any damages due to moisture or degas. As the protective films 1011 and 1012, a dense inorganic insulating film (such as a SiN film or a SiNO film) by a PCVD method, a dense inorganic insulating film (such as a SiN film or a SiNO film) by a sputtering method, a thin film containing carbon as its main component (such as a DLC film, a CN film, or an amorphous carbon film), a metal oxide film (such as $WO_2$, $CaF_2$, or $Al_2O_3$), or the like is preferably used.

Space 1014 between the first substrate 1001 and a second substrate 1016 are filled with a filling material or inert gas. In the case of filling inert gas such as nitrogen, a dry agent for drying is preferably provided in the space 1014.

Moreover, light from the light-emitting element is extracted through the first substrate 1001. FIG. 9 shows a light-emitting device of a bottom-emission type.

Although an example of a top-gate TFT is described in this embodiment, the present invention can be applied regardless of a TFT structure. For example, the present invention can be applied to a bottom-gate (inverted staggered) TFT or a staggered TFT.

This embodiment can be freely combined with any one of Embodiment Modes 1 to 3.

[Embodiment 2]

Figure 10:
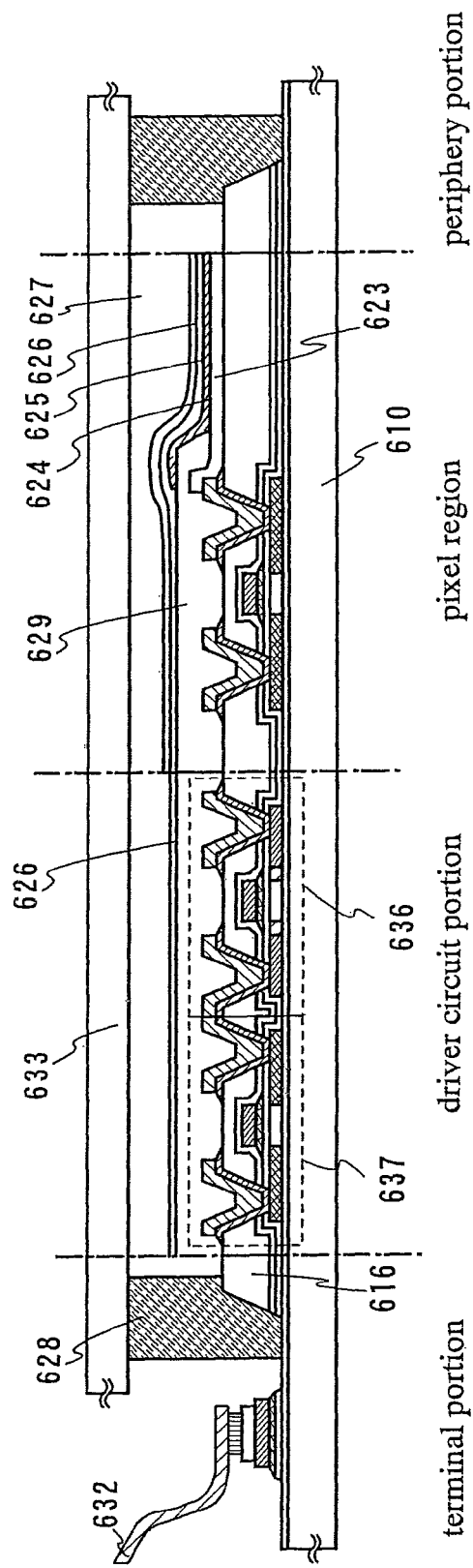
FIG. 10 is a cross-sectional view of an EL display panel (Embodiment 2)

This embodiment describes an example of a light-emitting device in which light can be extracted from both substrates by forming a pixel portion, a driver circuit, and a terminal portion over the same substrate with reference to FIG. 10.

After forming a base insulating film over a substrate 610, each semiconductor layer is formed. Next, after forming a gate insulating film covering the semiconductor layer, each gate electrode and terminal electrode are formed. Subsequently, the semiconductor is doped with an impurity element imparting n-type conductivity (typified by phosphorus or arsenic) to form an n-channel TFT 636, and the semiconductor is doped with an impurity element imparting p-type conductivity (typified by boron) to form a p-channel TFT 637. Thus, a source region, a drain region, and, if necessary, an LDD region are formed appropriately. Next, after forming a silicon nitride oxide film (SiNO film) containing hydrogen obtained by a PCVD method, activation of the impurity element doped in the semiconductor layer and hydrogenation are conducted.

Next, a flattening insulating film 616 to be an interlayer insulating film is formed. As the flattening insulating film 616, an insulating film whose skeletal structure includes a bond of silicon (Si) and oxygen (O) obtained by a coating method is used.

Next, a contact hole is formed in the flattening insulating film using a mask and, at the same time, the flattening insulating film at a periphery is removed.

Next, etching is conducted using the flattening insulating film 616 as a mask to remove selectively an exposed part of the SiNO film containing hydrogen or the gate insulating film.

After forming a conductive film, etching is conducted using the mask, thereby forming a drain wiring and a source wiring. The drain wiring has a two-layer structure, and the lower layer has a larger width than the upper layer in a portion to connect with the transparent conductive film later. In this embodiment, a portion where the lower layer is projected from the upper layer is formed in accordance with the steps of Embodiment Mode 1. Further, the side surface of the lower layer has a smaller tapered angle than the side surface of the upper layer.

Next, a first electrode 623 including a transparent conductive film, that is, an anode (or a cathode) of the organic light-emitting element is formed. The first electrode 623 is electrically connected to the projected portion of the lower layer.

Next, an SOG film (for example, a $SiO_x$ film containing an alkyl group) obtained by a coating method is patterned, thereby forming an insulator 629 (referred to as a bank, a partition wall, a barrier, an embankment, or the like) covering an end portion of the first electrode 623.

Next, a layer 624 containing an organic compound is formed by an evaporation method or a coating method. Next, a second electrode 625 including a transparent conductive film, that is, a cathode (or an anode) of the organic light-emitting element is formed. Next, a transparent protective layer 626 is formed by an evaporation method or a sputtering method. The transparent conductive layer 626 protects the second electrode 625.

Next, the light-emitting element is sealed by pasting a transparent sealing substrate 633 with a sealing material 628. That is to say, the light-emitting display device is sealed with a pair of substrates in such a way that the circumference of the display region is surrounded by the sealing material. Since the interlayer insulating film of the TFT is provided over the whole surface of the substrate, there is a risk that moisture or impurities intrude through a part of the interlayer insulating film located outside the pattern of the sealing material in the case where the pattern of the sealing material is drawn more inward than the circumference of the interlayer insulating film. Therefore, the sealing material is provided so as to cover the end portion of the flattening insulating film by overlapping the inside of the pattern of the sealing material, preferably the pattern of the sealing material, at the circumference of the flattening insulating film used as the interlayer insulating film of the TFT. The region surrounded by the sealing material 628 is filled with a transparent filling material 627.

Finally, an FPC 632 is pasted to the terminal electrode by an anisotropic conductive film 631 according to a known method. The terminal electrode is preferably formed with a transparent conductive film over the terminal electrode formed at the same time as the gate wiring (FIG. 10).

Further, light from the light-emitting element is extracted to both sides through the substrate 610 and the sealing substrate 633. FIG. 10 shows a light-emitting device having a structure in which light is extracted through both of the substrate and the sealing substrate.

According to the above steps, the pixel portion, the driver circuit, and the terminal portion can be formed over the same substrate.

This embodiment can be freely combined with any one of Embodiment Modes 1 to 3.

[Embodiment 3]

This embodiment describes an example of mounting a driver IC or an FPC in an EL display panel manufactured by the above embodiment.

Figure 11A:
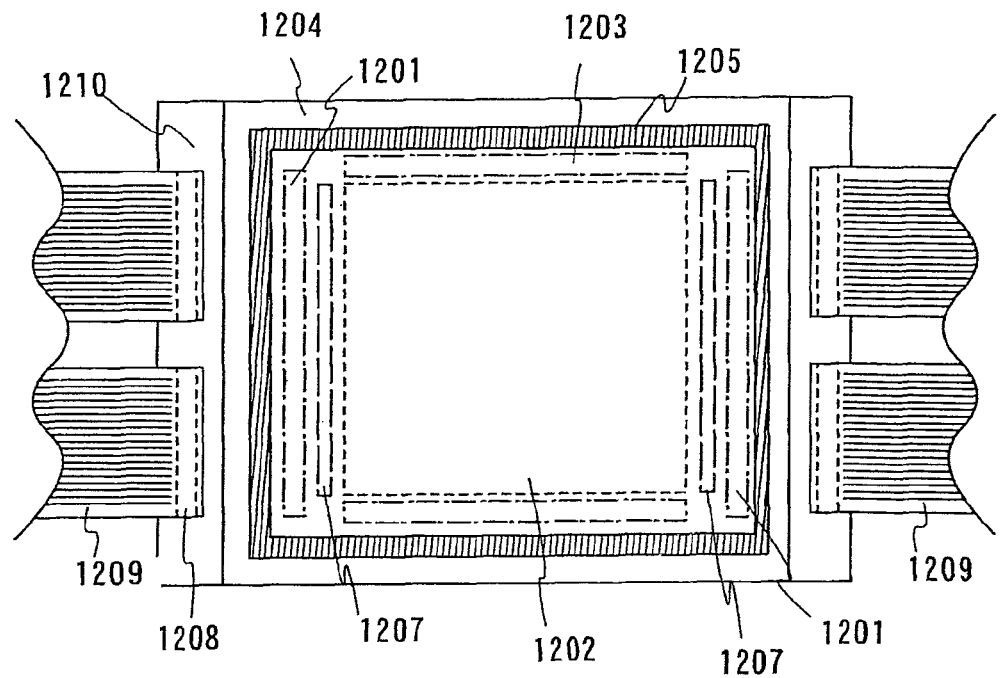
FIGS. 11A and 11B are top views showing an EL display panel (Embodiment 3)

FIG. 11A is a top view showing an example of a light-emitting device in which FPCs 1209 are pasted to four terminal portions 1208. Over a substrate 1210, a pixel portion 1202 including a light-emitting element and a TFT, a gate side driver circuit 1203 including a TFT, and a source side driver circuit 1201 including a TFT are formed. When a channel-forming region of the TFT is formed with a semiconductor film having a crystal structure, these circuits can be formed over the same substrate. Therefore, an EL display panel in which a system-on-panel is achieved can be manufactured.

A part of the substrate 1210 except the contact portion is covered with a protective film, and a base layer containing a material having a photocatalyst function is provided over the protective film.

Further, connection regions 1207 are provided at two locations so as to sandwich the pixel portion in order that the second electrode of the light-emitting element contacts the wiring of the lower layer. The first electrode of the light-emitting element is electrically connected with the TFT provided in the pixel portion.

A sealing substrate 1204 is fixed to the substrate 1210 by a sealing material 1205 surrounding the pixel portion and the driver circuit and a filling material surrounded by the sealing material 1205. Further, a filling material containing a transparent dry agent may be used. Further, a dry agent may be disposed in a region not overlapping the pixel portion.

FIG. 11A shows a structure which is preferable for a light-emitting device having a relatively large size of an XGA class (for example, 4.3 inch diagonal). Meanwhile, FIG. 11B shows an example of employing a COG method which is preferable for a small size (for example, 1.5 inch diagonal).

Figure 11B:
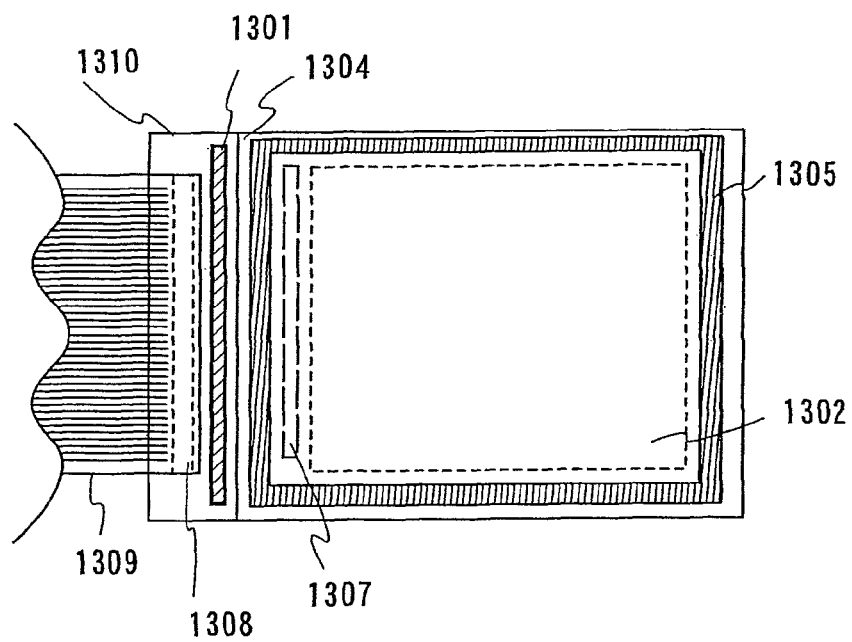

In FIG. 11B, a driver IC 1301 is mounted onto a substrate 1310, and an FPC 1309 is mounted onto a terminal portion 1308 disposed at a tip of the driver IC. A plurality of the driver ICs 1310 to be mounted are preferably formed over a rectangular substrate having a side of 300 mm to 1000 mm or more. That is to say, a plurality of circuit patterns having a driver circuit portion and an input/output terminal as a unit may be formed over the substrate, and each circuit pattern may be taken out by dividing the substrate at the last. The driver IC may have a rectangular shape whose long side has a length of 15 to 80 mm and short side has a length of 1 to 6 mm in consideration of the length of the pixel portion on a side or the pixel pitch. The length of the long side of the driver IC may be equal to one side of the pixel region or a sum of the length of one side of the pixel portion and the length of one side of the driver circuit.

The priority of the outside dimension of the driver IC to the IC chip lies in the length of the long side. When the driver IC has a long side of 15 to 80 mm, the number required for mounting in accordance with the pixel portion is fewer than that in the case of using the IC chip, thereby increasing the yield of the production. When the driver IC is formed over a glass substrate, the shape of the substrate used as a base material is not limited and the productivity is not lowered. This is a great advantage in comparison with the case of taking IC chips from a circular silicon wafer.

Further, a TAB method is also applicable. In a TAB method, a plurality of tapes may be pasted and the driver IC may be mounted to the tapes. Similarly to the COG method, a single driver IC may be mounted to a single tape. In such a case, a metal chip or the like for fixing the driver IC is preferably pasted in point of the strength.

The substrate 1310 is covered with a protective film in a portion other than the contact portion. A base layer containing a material having a photocatalyst function is provided over the protective film.

Further, a connection region 1307 is provided between the pixel portion 1302 and the driver IC 1301 so that the second electrode of the light-emitting element contacts the wiring of the lower layer. It is to be noted that the first electrode of the light-emitting element is electrically connected with the TFT provided in the pixel portion.

Further, the sealing substrate 1304 is fixed to the substrate 1310 by a sealing material 1305 surrounding the pixel portion 1302 and a filling material surrounded by the sealing material.

When the channel-forming region of the TFT is formed with an amorphous semiconductor film, the structure of FIG. 11B is employed even though the size is large because the driver circuit is difficult to be formed over the same substrate.

This embodiment can be freely combined with any one of Embodiment Modes 1 to 3 and Embodiments 1 and 2.

[Embodiment 4]

Figure 12:
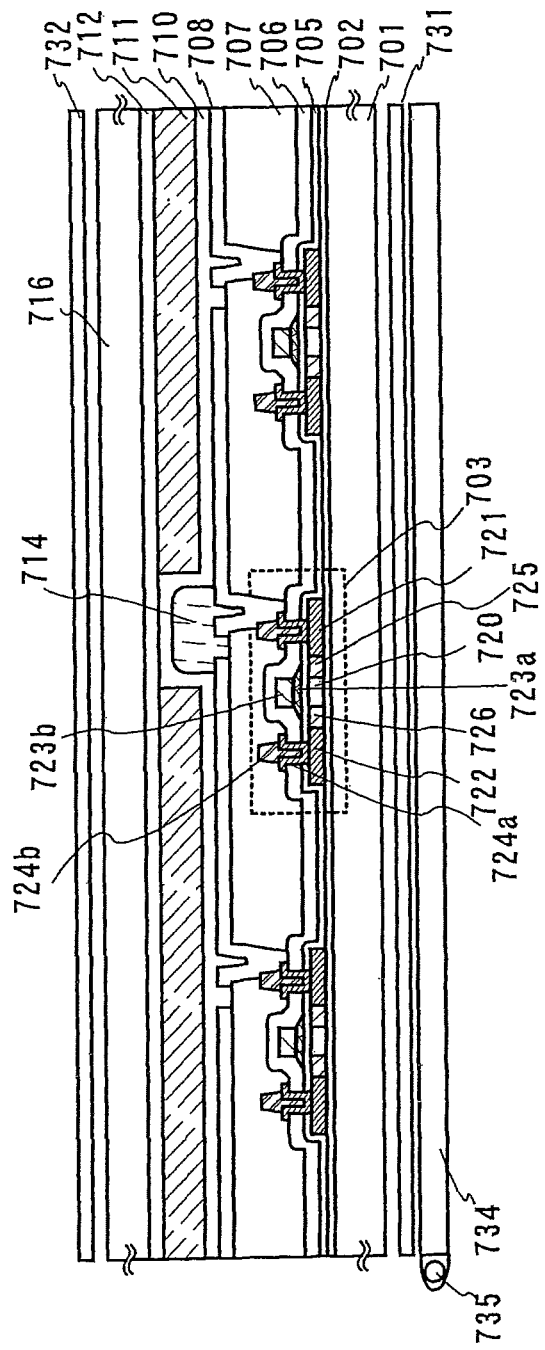
FIG. 12 is a cross-sectional view showing a liquid crystal panel (Embodiment 4)

This embodiment shows an example of a liquid crystal display device in which a pixel portion, a driver circuit, and a terminal portion are formed over the same substrate with reference to FIG. 12. FIG. 12 is a cross-sectional view of a liquid crystal panel not using a color filter.

This embodiment employs a field sequential driving method in which optical shutter is conducted by a liquid crystal panel not using a color filter and a backlight of three colors of RGB is blinked at high speed. According to the field sequential method, color display is achieved by continuous time additive color mixing utilizing a temporal resolution limit of a human eye.

Three TFTs 703 are provided over a first substrate 701 where a base insulating film 702 is provided. These TFTs are n-channel TFTs each having a channel-forming region 720, low-concentration impurity regions 725 and 726, source or drain regions 721 and 722, a gate insulating film 705, and a gate electrode. The gate electrode has two layers including a tapered lower layer 723a and an upper layer 723b.

The interlayer insulating film 706 is an inorganic insulating film. A flattening insulating film 707 covering the interlayer insulating film 706 is a flat interlayer insulating film formed by a coating method.

The drain wiring or the source wiring of the TFT has a two-layer structure. In a portion to connect with the transparent conductive film later, the lower layer 724a of the drain or source wiring has a larger width than the upper layer 724b of the drain or source wiring. Here, the lower layer of the drain or source wiring is formed with a Mo film, and the upper layer of the drain or source wiring is formed with an aluminum film. The drain or source wiring of the TFT preferably has a tapered shape in consideration of the coverage of the interlayer insulating film The pixel electrode 708 can be formed with a transparent conductive film such as ITO (indium tin oxide), ITSO (indium tin oxide containing silicon oxide obtained by a sputtering method using a target of ITO which contains silicon oxide by 2 to 10 wt %), a light-transmitting conductive film (IZO) in which zinc oxide (ZnO) is mixed into indium oxide containing silicon oxide by 2 to 20%, or ATO (antimony tin oxide) containing silicon oxide.

A pillar spacer 714 contains resin and serves to keep the distance between the substrates constant. Therefore, the pillar spacers 714 are provided at uniform intervals. For higher speed response, the distance between the substrates is preferably 2 µm or less and the height of the pillar spacer 714 is appropriately adjusted. When the screen size is as small as 2 inch or less on a side, the pillar spacers are not necessarily provided. The distance between the substrates may be appropriately adjusted only with a gap material such as a filler to be mixed into the sealing material.

Further, an orientation film 710 for covering the pillar spacer 714 and the pixel electrode 708 is provided. An orientation film 712 is also provided to the second substrate 716 to be an opposing substrate, and the first substrate 701 and the second substrate 716 are pasted with a sealing material (not shown).

The space between the first substrate 701 and the second substrate 716 is filled with a liquid crystal material 711. The substrates may be pasted to each other by dropping the liquid crystal material 711 under low pressure so that a bubble does not enter by the sealing material having a closed pattern. Alternatively, a dip method (pumping method) may be employed in which the liquid crystal is injected using capillary phenomenon after providing a seal pattern having an opening portion and pasting the TFT substrate.

A liquid crystal panel in this embodiment has a so-called it cell structure which uses an OCB (optically compensated bend) display mode. The it cell structure is a structure in which liquid crystal molecules are orientated in such a way that the pretilt angles of the liquid crystal molecules are in a plane-symmetric relation to a center plane between the active matrix substrate and the opposing substrate. The orientation state of the TC cell structure is splay orientation when voltage is not applied to the substrates, and shifts to bend orientation when voltage is applied. When the voltage is further applied, the liquid crystal molecules of the bend orientation are orientated perpendicular to the both substrates so that light can pass therethrough. In the OCB mode, response speed gets about 10 times higher than in a conventional TN mode.

Further, the liquid crystal panel is sandwiched between a pair of optical films (a polarizing plate, a retarder, or the like) 731 and 732. In addition, in the display using the OCB mode, a biaxial retarder is preferably used to compensate the viewing angle dependence of the retardation three-dimensionally.

An LED 735 of three colors of RGB is used as a backlight for a liquid crystal panel shown in FIG. 12. Light from the LED 735 is led by a light-guide plate 734. In the field sequential driving method, the LED is turned on in order of R, G, and B in a TR period, a TG period, and a TB period of an LED lighting period. In a lighting period (TR) of a red LED, a video signal (R1) corresponding to red is supplied to a liquid crystal panel, and a red image for one screen is written in the liquid crystal panel. In a lighting period (TG) of a green LED, video data (G1) corresponding to green is supplied to the liquid crystal panel and a green image for one screen is written in the liquid crystal panel. In a lighting period (TB) of a blue LED, video data (B1) corresponding to blue is supplied to the liquid crystal display device, and a blue image for one screen is written in the liquid crystal panel. One frame is formed by writing these three images.

[Embodiment 5]

Various electronic appliances can be manufactured by incorporating an EL panel or a liquid crystal panel obtained by the present invention. The electronic appliance is, for example, a camera such as a video camera or a digital camera, a goggle-type display, a navigation system, a sound reproduction apparatus (a car audio, an audio component, and so on), a personal computer, a game machine, a mobile information terminal (a mobile computer, a mobile phone, a mobile game machine, an electronic book, and so on), an image reproduction device equipped with a recording medium (specifically, a device which can reproduce a recording medium such as a digital versatile disk (DVD) and has a display for showing the image), and so on. FIGS. 13A to 13H and FIG. 14 show specific examples of these electronic appliances.

Figure 13A:
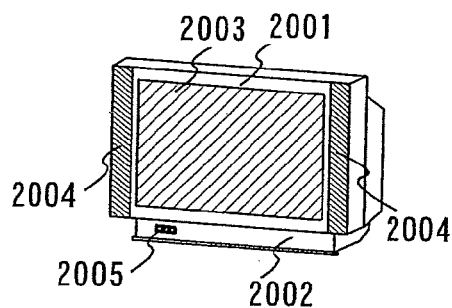
FIGS. 13A to 13H show examples of electronic appliances.

FIG. 13A shows a television including a case 2001, a supporting stand 2002, a display portion 2003, speaker portions 2004, a video input terminal 2005, and the like. The present invention is applied to semiconductor integrated circuits built in the television and the display portion 2003, and thus, the television consuming less electric power can be achieved. It is to be noted that all the televisions for a personal computer, TV broadcasting reception, advertisement display, and so on are included.

Figure 13B:
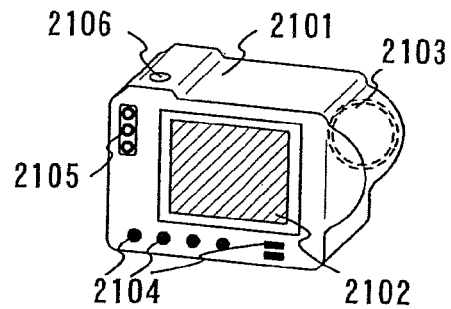

FIG. 13B shows a digital camera including a main body 2101, a display portion 2102, an image receiving portion 2103, operation keys 2104, an external connection port 2105, a shutter 2106, and so on. The present invention is applied to semiconductor integrated circuits (a memory, a CPU, and the like) built in the digital camera and thus, the digital camera consuming less electric power can be provided.

Figure 13C:
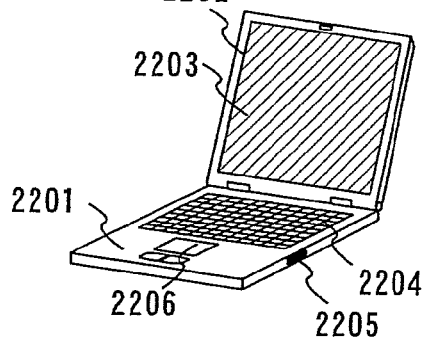

FIG. 13C shows a personal computer including a main body 2201, a case 2202, a display portion 2203, a keyboard 2204, an external connection port 2205, a pointing mouse 2206, and the like. The present invention is applied to semiconductor integrated circuits (such as a memory or a CPU) built in the personal computer and the display portion 2203. Thus, the contact resistance and the wirings used in TFTs provided in the display portion and a CMOS circuit constituting a part of a CPU can be decreased and the personal computer consuming less electric power can be achieved.

Figure 13D:
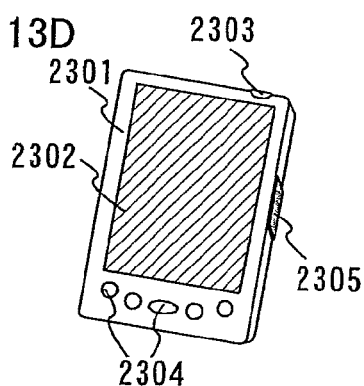

FIG. 13D shows an electronic book including a main body 2301, a display portion 2302, a switch 2303, operation keys 2304, an infrared port 2305, and the like. The present invention can be applied to semiconductor integrated circuits (such as a memory or a CPU) built in an electronic book and the display portion 2302, and the electronic book consuming less electric power can be achieved.

Figure 13E:
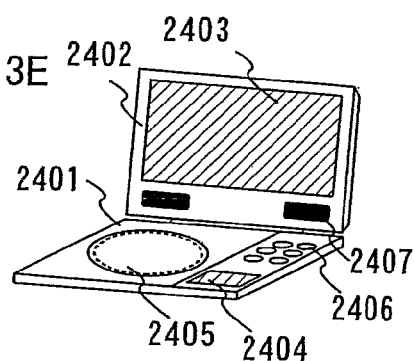

FIG. 13E shows a mobile image reproduction device equipped with a recording medium (specifically a DVD reproduction device), including a main body 2401, a case 2402, a display portion A2403, a display portion B2404, a recording medium (such as a DVD) reading portion 2405, operation keys 2406, speaker portions 2407, and so on. The display portion A2403 mainly displays image information, and the display portion B2404 mainly displays text information. The present invention is applied to semiconductor integrated circuits (such as a memory or a CPU) built in the image reproduction device and the display portions A2403 and B2404, and thus the image reproduction device consuming less electric power can be achieved.

Figure 13F:
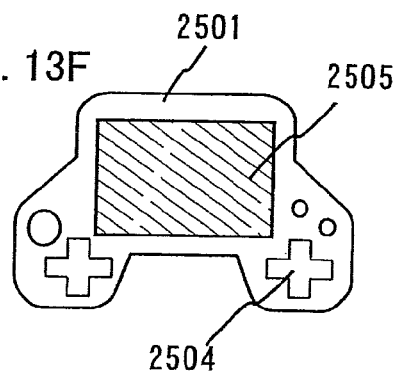

FIG. 13F shows a mobile game machine including a main body 2501, a display portion 2505, operation switches 2504, and so on. The present invention is applied to semiconductor integrated circuits (such as a memory or a CPU) built in the game machine and the display portion 2505, and thus, the game machine consuming less electric power can be achieved.

Figure 13G:
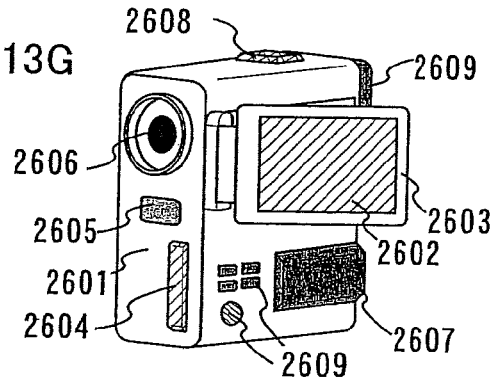

FIG. 13G shows a video camera including a main body 2601, a display portion 2602, a case 2603, an external connection port 2604, a remote control receiving portion 2605, an image receiving portion 2606, a battery 2607, an audio input portion 2608, operation keys 2609, and the like. The present invention can be applied to semiconductor integrated circuits (such as a memory or a CPU) built in the video camera and the display portion 2602, and thus, the video camera consuming less electric power can be achieved.

Figure 13H:
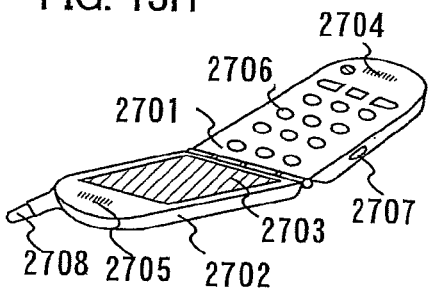

FIG. 13H shows a mobile phone including a main body 2701, a case 2702, an audio input portion 2704, an audio output portion 2705, operation keys 2706, an external connection port 2707, an antenna 2708, and the like. The present invention can be applied to semiconductor integrated circuits (such as a memory, a CPU, or a high-frequency circuit) built in the mobile phone and the display portion 2703, and thus, the mobile phone consuming less electric power can be achieved.

Figure 14:
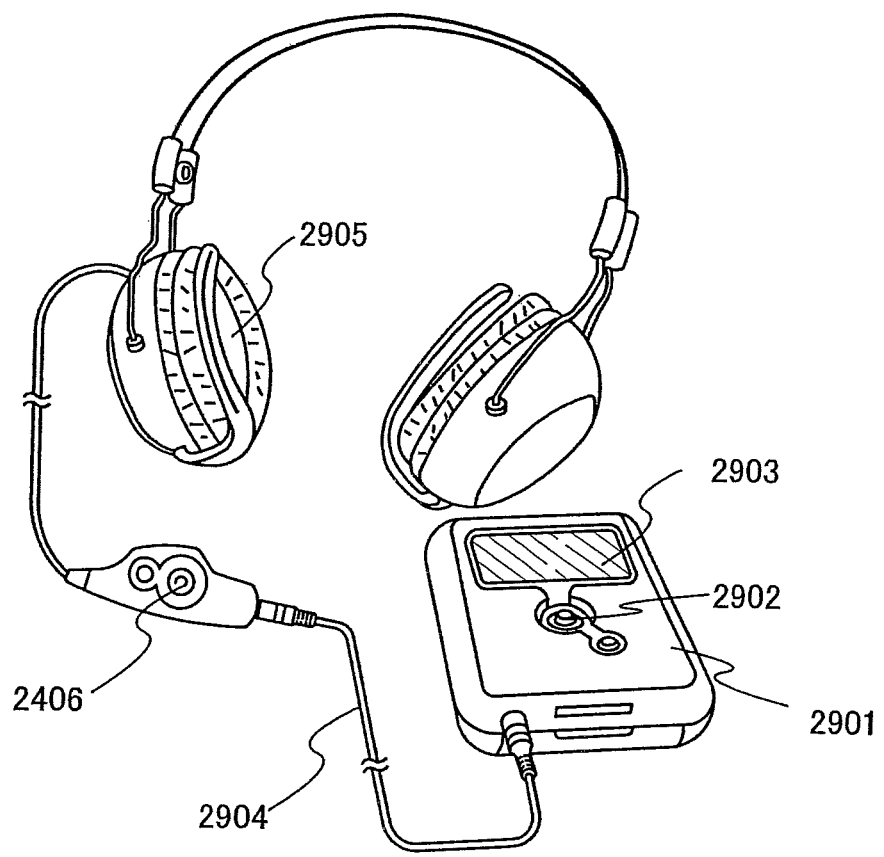
FIG. 14 shows an example of an electronic appliance.

FIG. 14 shows a mobile music reproduction device equipped with a recording medium, including a main body 2901, a display portion 2903, a recording medium (a card type memory, a compact HDD, or the like) reading portion 2902, operation keys 2902 and 2906, speaker portions 2905 of a headphone connected to a connection cord 2904, and the like. The present invention can be applied to the display portion 2903 and the music reproduction device consuming less electric power can be achieved.

This embodiment can be freely combined with any one of Embodiment Modes 1 to 3 and Embodiments 1 to 4.

The invention claimed is:

1. A semiconductor device comprising:
   a gate electrode over a substrate;
   a gate insulating layer over the gate electrode;
   a semiconductor layer over the gate insulating layer; and
   a source electrode and a drain electrode, over the semiconductor layer,
   wherein one of the source electrode and the drain electrode is electrically connected to the semiconductor layer, and has a first electrode layer and a second electrode layer,
   wherein the second electrode layer is formed on the first electrode layer,
   wherein the first electrode layer comprises titanium,
   wherein the second electrode layer comprises aluminum,
   wherein a first width of the first electrode layer is larger than a second width of the second electrode layer,
   wherein an upper surface of the second electrode layer is in contact with an insulating layer,
   wherein the first electrode layer is in contact with a pixel electrode,
   wherein the semiconductor layer comprises an amorphous silicon, and
   wherein the pixel electrode comprises an ITO.

2. The semiconductor device according to claim 1,
   wherein the second electrode layer is in contact with the pixel electrode.

3. The semiconductor device according to claim 1, further comprising:
   a second insulating layer between the semiconductor layer and the one of the source electrode and the drain electrode.

4. The semiconductor device according to claim 1,
   wherein the gate electrode comprises tantalum nitride and tungsten.

5. A semiconductor device comprising:
   a gate electrode over a substrate;
   a gate insulating layer over the gate electrode;
   a semiconductor layer over the gate insulating layer;
   a source electrode and a drain electrode, over the semiconductor layer;
   a pixel electrode electrically connected to one of the source electrode and the drain electrode;
   an orientation film over the pixel electrode; and
   a liquid crystal layer over the orientation film,
   wherein one of the source electrode and the drain electrode is electrically connected to the semiconductor layer, and has a first electrode layer and a second electrode layer,
   wherein the second electrode layer is formed on the first electrode layer,
   wherein the first electrode layer comprises titanium,
   wherein the second electrode layer comprises aluminum,
   wherein a first width of the first electrode layer is larger than a second width of the second electrode layer,
   wherein an upper surface of the second electrode layer is in contact with an insulating layer,
   wherein the first electrode layer is in contact with the pixel electrode,
   wherein the semiconductor layer comprises an amorphous silicon, and
   wherein the pixel electrode comprises an ITO.

6. The semiconductor device according to claim 5,
   wherein the second electrode layer is in contact with the pixel electrode.

7. The semiconductor device according to claim 5, further comprising:
   a second insulating layer between the semiconductor layer and the one of the source electrode and the drain electrode.

8. The semiconductor device according to claim 5,
   wherein the gate electrode comprises tantalum nitride and tungsten.

9. A semiconductor device comprising:
   a gate electrode over a substrate;
   a gate insulating layer over the gate electrode;
   a semiconductor layer over the gate insulating layer;
   a source electrode and a drain electrode, over the semiconductor layer;
   a pixel electrode electrically connected to one of the source electrode and the drain electrode;
   an orientation film over the pixel electrode; and
   a liquid crystal layer over the orientation film,
   wherein one of the source electrode and the drain electrode is electrically connected to the semiconductor layer, and has a first electrode layer and a second electrode layer,
   wherein the second electrode layer is formed on the first electrode layer,
   wherein the first electrode layer comprises titanium,
   wherein the second electrode layer comprises aluminum,
   wherein a first width of the first electrode layer is larger than a second width of the second electrode layer,
   wherein an upper surface of the second electrode layer is in contact with an insulating layer,
   wherein the first electrode layer is in contact with the pixel electrode,
   wherein the semiconductor layer comprises an amorphous silicon,
   wherein the pixel electrode comprises an ITO, and
   wherein the gate electrode, the semiconductor layer, the source electrode and the drain electrode are provided in a pixel region.

10. The semiconductor device according to claim 9,
    wherein the second electrode layer is in contact with the pixel electrode.

11. The semiconductor device according to claim 9, further comprising:
    a second insulating layer between the semiconductor layer and the one of the source electrode and the drain electrode.

12. The semiconductor device according to claim 9, wherein the gate electrode comprises tantalum nitride and tungsten.

* * * * *